United States Patent
Bhandarkar et al.

(10) Patent No.: US 10,727,735 B2
(45) Date of Patent: Jul. 28, 2020

(54) DIGITAL CONTROL OF SWITCHED BOUNDARY MODE INTERLEAVED POWER CONVERTER WITH REDUCED CROSSOVER DISTORTION

(71) Applicant: Microchip Technology Incorporated, Chandler, AZ (US)

(72) Inventors: Santosh Manjunath Bhandarkar, Chandler, AZ (US); Alex Dumais, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/051,872

(22) Filed: Aug. 1, 2018

(65) Prior Publication Data

US 2019/0052168 A1 Feb. 14, 2019

Related U.S. Application Data

(60) Provisional application No. 62/543,189, filed on Aug. 9, 2017.

(51) Int. Cl.
  *H02M 3/158* (2006.01)
  *H02M 1/42* (2007.01)
  *H03K 17/13* (2006.01)

(52) U.S. Cl.
  CPC ....... *H02M 1/4225* (2013.01); *H02M 3/1584* (2013.01); *H03K 17/133* (2013.01); *H02M 2003/1586* (2013.01)

(58) Field of Classification Search
  None
  See application file for complete search history.

(56) References Cited

U.S. PATENT DOCUMENTS

| | | | |
|---|---|---|---|
| 6,448,745 B1 | 9/2002 | Killat | 323/222 |
| 8,098,505 B1 * | 1/2012 | Choi | H02M 1/4225 323/272 |

(Continued)

FOREIGN PATENT DOCUMENTS

WO 2006/029323 A2 3/2006 ............ H02H 3/20

OTHER PUBLICATIONS

International Search Report and Written Opinion, Application No. PCT/US2018/045492, 10 pages, dated Nov. 7, 2018.

(Continued)

*Primary Examiner* — Jeffrey A Gblende
(74) *Attorney, Agent, or Firm* — Slayden Grubert Beard PLLC

(57) ABSTRACT

A circuit arrangement, signal processor, and method for interleaved switched boundary mode power conversion are disclosed. The circuit arrangement comprises at least an input for receiving an alternating input voltage from a power supply; an output to provide an output voltage to a load; a first interleaved circuit comprising: a first energy storage device; and a first controllable switching device; and one or more secondary interleaved circuits, each comprising: a secondary energy storage device; and a secondary controllable switching device; and a signal processor. The signal processor is connected to the controllable switching devices and comprises at least a first switching cycle controller, configured for cycled zero-current switching operation of the first controllable switching device; and one or more secondary switching cycle controllers, configured for cycled zero-current switching operation of the one or more secondary controllable switching devices The signal processor is configured to disable one or more of the interleaved circuits when the alternating input voltage is lower than a first threshold voltage to reduce the zero-crossing time.

29 Claims, 19 Drawing Sheets

(56) References Cited

U.S. PATENT DOCUMENTS

| | | | |
|---|---|---|---|
| 8,406,021 B2 | 3/2013 | Green | 363/89 |
| 8,901,901 B2 | 12/2014 | Ziegler et al. | 323/271 |
| 9,240,712 B2 | 1/2016 | Chandrasekaran | |
| 9,973,089 B1 | 5/2018 | Terasawa et al. | |
| 10,164,521 B2 | 12/2018 | Castelli | |
| 2005/0018458 A1 | 1/2005 | Shimada et al. | 363/125 |
| 2006/0077604 A1 | 4/2006 | Jansen | 361/90 |
| 2008/0205103 A1 | 8/2008 | Sutardja et al. | 363/84 |
| 2008/0246444 A1 | 10/2008 | Shao et al. | 323/207 |
| 2009/0206805 A1 | 8/2009 | Choi et al. | 323/271 |
| 2009/0257257 A1 | 10/2009 | Adragna et al. | 363/65 |
| 2009/0267658 A1 | 10/2009 | Bridge et al. | 327/141 |
| 2010/0097828 A1 | 4/2010 | Chen | 363/72 |
| 2010/0165683 A1 | 7/2010 | Sugawara | 363/126 |
| 2010/0244789 A1* | 9/2010 | Osaka | H02M 3/1584 323/271 |
| 2011/0110134 A1* | 5/2011 | Gaboury | H02M 1/4225 363/126 |
| 2011/0149622 A1 | 6/2011 | Lin | 363/124 |
| 2012/0092905 A1* | 4/2012 | Srighakollapu | H02M 3/33523 363/37 |
| 2012/0224401 A1 | 9/2012 | Phadke | 363/84 |
| 2012/0262958 A1 | 10/2012 | Feldtkeller et al. | 363/44 |
| 2014/0103861 A1 | 4/2014 | Carletti et al. | 320/107 |
| 2014/0176089 A1 | 6/2014 | Yang et al. | 323/207 |
| 2014/0334196 A1 | 11/2014 | Chen et al. | 363/21.04 |
| 2014/0362614 A1 | 12/2014 | Koga | 363/21.17 |
| 2015/0146458 A1 | 5/2015 | Lim | 363/44 |
| 2016/0105096 A1 | 4/2016 | Chen et al. | 323/210 |
| 2016/0276924 A1 | 9/2016 | Castelli et al. | 363/21.13 |
| 2018/0020515 A1 | 1/2018 | Rutgers | |
| 2018/0109191 A1 | 4/2018 | Chan et al. | |
| 2019/0052179 A1 | 2/2019 | Bhandarkar et al. | |

OTHER PUBLICATIONS

International Search Report and Written Opinion, Application No. PCT/US2018/045479, 12 pages, dated Oct. 19, 2018.
International Search Report and Written Opinion, Application No. PCT/US2018/045485, 10 pages, dated Nov. 27, 2018.
U.S. Non-Final Office Action, U.S. Appl. No. 16/052,026 29 pages, dated Apr. 4, 2019.
U.S. Non-Final Office Action, U.S. Appl. No. 16/165,384, 19 pages, dated Apr. 8, 2019.
Morroni, Jeffrey et al., "Design and Implementation of an Adaptive Tuning System Based on Desired Phase Margin for Digitally Controlled DC-DC Converters," IEEE Transactions on Power Electronics, vol. 24, No. 2, pp. 559-564, Feb. 1, 2009.
Juang, Kai-Cheung et al., "A Grid-Tied Flyback-Based PV Inverter with BCM Variable Frequency Voltage Mode Control," IEEE International Symposium on Intelligent Signal Processing and Communication Systems, pp. 598-603, Nov. 4, 2012.
Ryan, Robert T. et al., "Digital Control of an Interleaved BCM Boost PFC Converter with Fast Transient Response at Low Input Voltage," IEEE Energy Conversion Congress and Exposition, pp. 257-264, Nov. 1, 2017.
U.S. Non-Final Office Action, U.S. Appl. No. 16/052,208, 13 pages, dated Dec. 13, 2018.
International Search Report and Written Opinion, Application No. PCT/US2018/056989, 17 pages, dated Jan. 31, 2019.
U.S. Final Office Action, U.S. Appl. No. 16/052,208, 19 pages, dated Jun. 5, 2019.

* cited by examiner

DIGITAL CONTROL OF SWITCHED BOUNDARY MODE INTERLEAVED POWER CONVERTER WITH REDUCED CROSSOVER DISTORTION

RELATED PATENT APPLICATION

This application claims priority to U.S. Provisional Patent Application No. 62/543,189 filed Aug. 9, 2017, the entire contents of which are hereby incorporated by reference for all purposes.

TECHNICAL FIELD

The present disclosure relates to power converters and, more particularly, to control of an interleaved boundary mode power converter with reduced crossover distortion.

BACKGROUND

Power converters and in particular switched-mode power converters are used in a variety of applications to provide AC/DC and DC/DC conversion. For example, switched-mode power converters, also referred to as switched-mode power supplies (SMPS), are widely used in computer and mobile phone power supply units to provide the necessary operating voltages from typical 120V/240V AC mains lines.

Typical items of concern when designing power converters relate to conversion efficiency and cost. It should be readily apparent that power losses should be minimized to increase the overall efficiency of the converter and also to reduce the generation of heat, which may be difficult to dissipate depending on the design and the respective application.

It is known to operate switched-mode power converters in boundary conduction mode or short "boundary mode" (BCM). Unlike a continuous operation in CCM (continuous conduction mode), in boundary conduction mode it is aimed to operate the switch of the power converter when no or no substantial current flows through the switch. This operational mode reduces switching losses and also allows to use less expensive components, for example less expensive boost diodes in a boost switched-mode power converter setup due to no reverse-recovery losses. In addition, BCM also allows for power factor correction (PFC), in view that the input current follows the input voltage waveform.

A by-product of BCM is that the converter inherently uses a variable switching frequency. The frequency depends primarily on the selected output voltage, the instantaneous value of the input voltage, the parameters of the energy storage used, e.g., inductance or capacitance, and the output power delivered to the load. The lowest frequency occurs at the peak of sinusoidal line voltage, the highest frequency near the zero-crossings of the sinusoidal line voltage.

Interleaved power converters are used when higher currents are to be converted. These types of power converters comprise multiple stages/circuits, typically arranged in parallel to each other. The term "interleaved" in the present context means that multiple circuits are operated out of phase. For example, in an interleaved power converter having two stages, the stages typically operate at 180 degrees out of phase, i.e., half the switching cycle out of phase. Interleaved power converters bear the advantage of causing less input current variation/ripple and thus cause less electromagnetic interference issues.

A problem when operating an interleaved power converter in boundary conduction mode resides in the fact that the input voltage is very small near the zero-crossing points. Near the zero-crossing points, the input energy is not transferred to output side as it is spent in charging internal device parasitics, such as for example capacitances of MOSFET switches. Further due to the high switching frequency near the zero-crossing points of the input voltage, typical filters for electromagnetic interference (EMI) attenuate such high frequency components, resulting in a prolonged zero current situation near the zero-crossing points and a distorted current waveform.

SUMMARY

An object thus exists to provide an efficient circuit arrangement and method for interleaved switched-mode power conversion that allows to operate in boundary conduction mode with reduced crossover distortion.

The object is solved by a circuit arrangement, a signal processor, and a method for interleaved switched boundary mode power conversion according to the independent claims. The dependent claims as well as the following description contain various embodiments of the invention.

In one aspect, a circuit arrangement for interleaved switched boundary mode power conversion is provided that comprises at least an input for receiving an input voltage from a power supply, an output to provide an output voltage to a load, a first interleaved circuit, one or more secondary interleaved circuits, and a signal processor. According to this aspect, the first interleaved circuit comprises at least a first energy storage device and a first controllable switching device. The one or more secondary interleaved circuits each comprise at least a secondary energy storage device and a secondary controllable switching device. The signal processor is connected to the controllable switching devices and comprises at least a first switching cycle controller, configured for cycled/recurrent zero-current switching operation of the first controllable switching device; and one or more secondary switching cycle controllers, configured for cycled/recurrent zero-current switching operation of the secondary controllable switching devices.

The signal processor is configured to disable one or more of the interleaved circuits when the alternating input voltage is lower than a first threshold voltage to reduce the zero-crossing time.

A basic idea of the invention is to allow operating an interleaved switched-mode power converter with improved total harmonic distortion (THD) in boundary conduction mode. As the inventors of the instant invention have ascertained, in this specific type of power converter, the on-time near a zero-crossing is not sufficient to charge the parasitic capacitance of the switching devices and thus, the respective time periods do not contribute to the energy transfer to the output. Further, the switching frequency near zero-crossing points of the input voltage is in a range where typical electromagnetic interference (EMI) filters interfere with the switching operation and limit the possible current draw. This results in a zero-current situation being prolonged, leading to a distorted input current waveform and thus, a comparably high THD.

The invention thus proposes to disable one or more of the interleaved circuits when the alternating input voltage is lower than a first threshold voltage. This reduces the overall switching frequency that is "seen" by an input EMI filter near zero-crossing points. In addition, the current amplitude through the remaining, i.e., non-disabled interleaved circuits is increased. Both effects effectively reduce the time of the zero-current situation as it allows a faster current draw from the power supply. The invention accordingly allows a high power factor operation while providing a low THD.

BRIEF DESCRIPTION OF THE DRAWINGS

The above and other objects, features, and advantages of the current invention will become apparent from the following discussion of various embodiments. In the FIGS.

DETAILED DESCRIPTION

Figure 1:
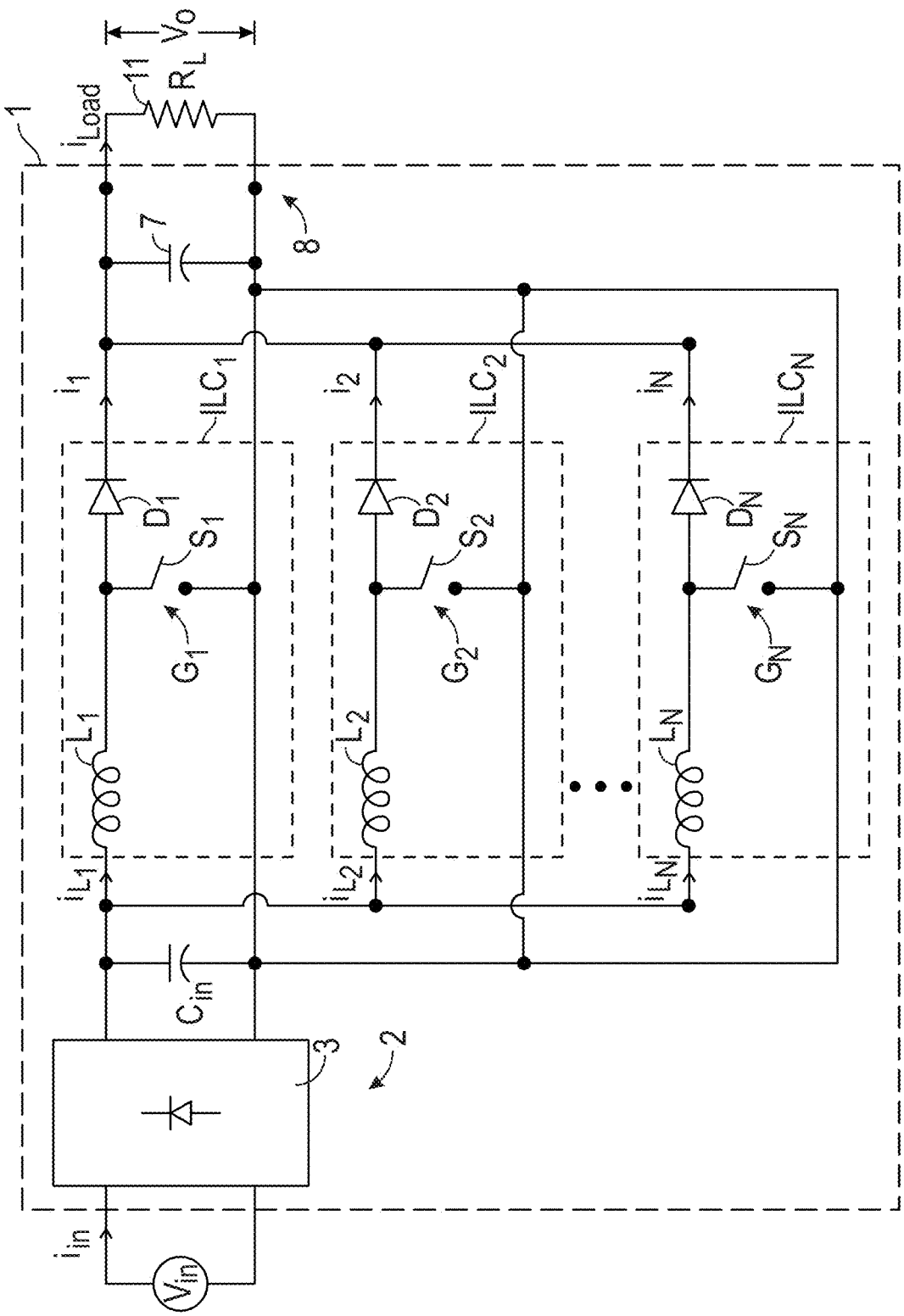
FIG. 1 shows a schematic block diagram of an embodiment of a circuit arrangement for switched boundary conduction mode (BCM) power conversion.

Technical features described in this application can be used to construct various embodiments of circuit arrangements, signal processors, and integrated circuit devices. Some embodiments of the invention are discussed so as to enable one skilled in the art to make and use the invention.

As discussed in the preceding, and in one aspect, a circuit arrangement for interleaved switched boundary mode power conversion is provided that comprises at least an input for receiving an input voltage from a power supply, an output to provide an output voltage to a load, a first interleaved circuit, one or more secondary interleaved circuits, and a signal processor.

According to this aspect, the first interleaved circuit comprises at least a first energy storage device and a first controllable switching device. The one or more secondary interleaved circuits each comprise at least a secondary energy storage device and a secondary controllable switching device. The signal processor is connected to the controllable switching devices and comprises at least a first switching cycle controller, configured for cycled/recurrent zero-current switching operation of the first controllable switching device; and one or more secondary switching cycle controllers, configured for cycled/recurrent zero-current switching operation of the secondary controllable switching devices.

The signal processor is configured to disable one or more of the interleaved circuits when the alternating input voltage is lower than a first threshold voltage to reduce the zero-crossing time.

In the context of the present discussion, the term "switched boundary mode power conversion" is understood as switched-mode electric power conversion in boundary conduction mode (BCM). A corresponding converter circuit comprises at least an energy storage device and a switching device for storing input energy temporarily and then releasing that energy to the output at a different voltage.

In some embodiments, the value of the energy storage device such as an inductor may be selected to be large in comparison to the total resistance in the circuit. The resistance (R) could be present in the form of inductor resistance, switching device resistance, filter resistance, board trace resistance etc. The inductor current in some embodiments follows a path based on the final value of current during ON time as $If*e^{(-t/\zeta)}$ where $If=Vin/R$, $\zeta=L/R$. The inductor current appears as a straight line if $\zeta$ is large. One way to increase the value of $\zeta$ is to reduce the resistance (R) value by using efficient switches and inductors. During the OFF time, the load resistance contributes to R in addition to other resistances. The value of L may be set in some embodiments by the input voltage, load range, and switching frequency limits.

In BCM, a new switching period is initiated when the current through the energy storage device returns to zero, which is at the boundary of continuous conduction (CCM) and discontinuous conduction mode (DCM).

Interleaved power conversion and a corresponding interleaved power converter is understood as using multiple stages, also referred to as "interleaved circuits" in the following, which are operated out of phase. For example, in an interleaved power converter having two interleaved circuits, the circuits typically operate at 180 degrees out of phase. In the present context, an "interleaved circuit" comprises at least an energy storage device and a controllable switching device. Typically, the interleaved circuits are connected in parallel with each other.

An "energy storage device" in the present context is understood as a device for storing electrical energy at least temporarily. For example, an energy storage device may comprise one or more inductors/inductances and/or one or more capacitors/capacitances.

A "controllable switching device" in the present context may be of any suitable type to control an electrical current. The switching device may comprise for example one or more semiconductor switches, such as bipolar transistors, field-effect transistors, MOSFETs, IGBTs, SiCs, GANs, etc.

According to the present aspect, the circuit arrangement comprises the signal processor. In this context, a signal processor is understood as a device that allows for cycled controlling of the switching device, for example according to a pulse-width-modulation (PWM), with a frequency in the kHz range. In some examples, the signal processor is configured to control the switch in PWM mode with a frequency of approximately 500 kHz. In some embodiments, the signal processor is a digital signal processor (DSP), e.g., a DSP with PWM units, ADCs, etc. A DSP architecture facilitates faster execution of instructions for the zero-current point detection.

The signal processor according to the present aspect comprises at least a first switching cycle controller and one or more secondary switching cycle controllers, which switching cycle controllers are configured for zero-current switching. In this context, "zero-current switching" is understood as controlling the switching device when no or just a minor current of, e.g., less than 100 μA, is flowing. As will be apparent in view that the circuit arrangement is configured for boundary conduction mode operation, zero-current switching in particular relates to the control from an off-state, i.e., non-conductive state of the switching device, to an on-state, i.e., a conductive state of the switching device when no or just a minor current is flowing.

A "zero-current point" of the energy storage device in the context of the present explanation is understood as the point in time when the energy storage device is completely discharged after a charge/discharge cycle, also referred to as "switching cycle" herein.

A "switching cycle" in this context is consequently understood as the combined time of the respective controllable switching device being set conductive, i.e., in the on-state, and the controllable switching device subsequently being set non-conductive, i.e., in the off-state. In case of a PWM control, the switching cycle corresponds to the PWM cycle time T.

A "mid-cycle" time corresponds to half the switching cycle period and is thus a point in time in each switching cycle that is equally spaced between two subsequent zero-current points of the energy storage device.

According to the present aspect, the signal processor is configured to disable one or more of the interleaved circuits when the alternating input voltage is lower than a first threshold voltage to reduce the zero-crossing time. The term "zero-crossing time" relates to the time, the input current remains close to 0 A when the input voltage is at a zero-crossing, i.e., 0V.

The threshold voltage herein is understood as a threshold, determined by the signal processor. In some embodiments, the level of the threshold voltage is predefined, e.g., by the number of interleaved circuits present. In additional or alternative embodiments, the level of the threshold voltage is changed dynamically by the signal processor, such as, e.g., based on an input voltage level (peak) from a previous half cycle of an alternating input voltage.

The term "alternating input voltage" herein refers to a true alternating voltage or a full wave rectified positive or negative input voltage. It is noted, that the disabling of a interleaved circuit herein means that the respective controllable switching device is not operated and set to a non-conductive state. Accordingly, the term of a "disabled interleaved circuit" corresponds to a "disabled switching device" and these terms are used interchangeably. Similarly, a "non-disabled interleaved circuit" means that the respective controllable switching device is operated normally according to one of the switching patterns described herein, i.e., a "non-disabled switching device" or a remaining/operational switching device.

In some embodiments, and in a given switching cycle, an on-time period of each of the controllable switching devices is controlled by the signal processor to correspond to an each other. Accordingly, the time period in the switching cycle, in which each of the switching devices are controlled conductive, at least substantially matches, i.e., is substantially the same. In this context, the term "substantially" is understood to comprise slight deviations in the on-time periods of some nanoseconds. A deviation in the switching time period of the multiple interleaved circuits may be in the range of some 100 nanoseconds.

In some embodiments, the signal processor is further configured to control a gain multiplier for at least one of an on-time period of the controllable switching devices and a switching cycle time, wherein in case one or more of the interleaved circuits are disabled, the gain multiplier is increased.

In the present context, the term "gain multiplier" is a multiplication factor used when one or more interleaved circuits are disabled. The signal processor may in some embodiments be configured so that the gain multiplier affects the on-time period of the operable controllable switching devices and/or the switching cycle time of the operable switching devices, i.e., the non-disabled switching devices of corresponding non-disabled interleaved circuits. A main idea of using the gain multiplier is to increase the on-time and thereby to further reduce the switching frequency and to keep the dynamic performance of the circuit unaffected by the disabling of one or more interleaved circuit.

In some embodiments, the signal processor is configured, so that the gain multiplier affects the on-time period and the switching cycle time of the operable switching devices.

In some embodiments, the increase of the gain multiplier depends on the number of disabled interleaved circuits. In alternative or additional embodiments, the increase of the gain multiplier corresponds to the quotient of the total number of interleaved circuits in the circuit arrangement by the number of non-disabled interleaved circuits.

In some embodiments, the gain multiplier is set in such a way that the open loop system bandwidth is the same for all operating conditions. Due to this, the system transient response is same throughout. The time required for the output to settle in the event of a load change may be the same throughout independent of the number of stages operating.

The term "open loop system bandwidth" herein is understood as the frequency at which the value of the open loop system gain is 3 dB below the DC gain. The term "open loop system bandwidth" typically is used in conjunction with the Bode stability analysis. The Bode analysis may predict the closed loop system stability based on the open loop gain. Bandwidth determines the transient response of the system to changes in external load conditions.

According to some embodiments, the signal processor is further configured to control phases between the on-time periods of the first and the one or more secondary switching controllers, so that the on-time periods are distributed over the given switching cycle.

As will be apparent, this may "equalize" the current input and thus reduce an overall current ripple at the input and consequently reduce electromagnetic interference effects.

In some embodiments, the on-time periods are distributed evenly over the given switching cycle, which provides a particularly beneficial reduction of overall current ripple. However, it is noted that any distribution of the on-time periods, i.e., avoidance of having the on-time periods of all controllable switching devices simultaneously, will reduce the overall current ripple.

In some embodiments, the signal processor is further configured to control, in a given switching cycle, an on-time period of the controllable switching devices, wherein in case one or more of the interleaved circuits are disabled, the on-time period of controllable switching devices of non-disabled, i.e., the "remaining" operational interleaved circuits, is increased. In some embodiments, the increase of the on-time period depends on the number of disabled interleaved circuits. In further embodiments, the increase in on-ime does not alter the dynamic performance of the system at any point in the alternating input voltage cycle.

In some embodiments, the phases between the on-time periods of the non-disabled interleaved circuits is set to correspond to ((n−1))/N*360, where N is the total number of interleaved non-disabled circuits and n is an index number of the respective secondary interleaved circuit. Accordingly, for a given secondary interleaved circuit n, the respective phase can be determined as $$\frac{(n-1)}{N} * 360.$$

For example, given a total of N=3 operational interleaved circuits, the phase of a first secondary interleaved circuit, i.e., circuit n=2, is 120 degrees, while the phase of a second secondary interleaved circuit, i.e., circuit n=3, is 240 degrees. It is noted, that the term "phase" herein relates to the delay, the controllable switching device of the respective secondary interleaved circuit is set to an on-state, compared with the time, the controllable switching device of the first interleaved circuit is set to an on-state. The angular phase is defined over the switching cycle, e.g., in a PWM, the PWM cycle with time T.

In some embodiments, the signal processor is configured to disable an increasing number of the controllable switching devices with a decrease of the alternating input voltage.

In some embodiments, the signal processor is configured with multiple different threshold voltages. For example, first threshold voltage may be the highest of the threshold voltages and each other threshold voltage of the multiple threshold voltages is half of a another threshold voltage of the multiple threshold voltages, so that a "staggered" setup of threshold voltages result. For example, the number of threshold voltages may depend on the number of interleaved circuits of the circuit arrangement.

In some embodiments, the signal processor is configured to disable a number of interleaved circuits when the alternating input voltage falls below one of the multiple threshold voltages. In one example, one interleaved circuit is disabled per threshold voltage. In another example, the number of interleaved circuits that are disabled depends on the number of threshold voltages and secondary interleaved circuits to distribute the disabling of interleaved circuits equally between a peak of the alternating input voltage and a subsequent zero-crossing, where all interleaved circuits are operated upon a peak and only the first interleaved circuit is operated at a zero-crossing. In some embodiments, the number of threshold voltages is selected as a multiple of 2 to allow an efficient implementation.

In some embodiments, the number of threshold voltages corresponds to the binary logarithm of the number of interleaved circuits of the circuit arrangement. In alternative embodiments, number of threshold voltages is dynamically determined, based on a peak level of the input voltage, i.e., a peak from the previous half cycle of the alternating input voltage.

In some embodiments, the one or more of the threshold voltages, i.e., the number and/or voltage levels of each threshold voltage, are predefined, e.g., my the manufacturer of the circuit arrangement.

Reference will now be made to the drawings in which the various elements of embodiments will be given numerical designations and in which further embodiments will be discussed.

Specific references to components, modules, units, devices, sections, parts, process steps, and other elements are not intended to be limiting. Further, it is understood that like parts bear the same or similar reference numerals, when referring to alternate figures. It is further noted that the figures are schematic and provided for guidance to the skilled reader and are not necessarily drawn to scale. Rather, the various drawing scales, aspect ratios, and numbers of components shown in the figures may be purposely distorted to make certain features or relationships easier to understand.

FIG. 1 shows a schematic block diagram of an embodiment of a circuit arrangement for switched boundary conduction mode (BCM) power conversion, namely in the instant embodiment, a switched-mode boost converter circuit 1.

The boost converter circuit 1 comprises an input or input stage 2, configured for connection to a typical mains connection, e.g., at 110V, 60 Hz or 240V, 50 Hz. A bridge rectifier 3 is provided at the input 2 to obtain positive half-waves. The boost converter circuit 1 further comprises a first interleaved circuit $ILC_1$ and multiple secondary interleaved circuits $ILC_2, \ldots,$ to $ILC_N$, connected with each other in parallel and each comprising an energy storage device in the form of an inductor $L_N$, MOSFET switching device $S_N$, and flyback diode $D_N$, where the index N refers to the respective interleaved circuit $ILC_1, ILC_2, \ldots,$ to $ILC_N$. As will be apparent from FIG. 1, the boost converter circuit 1 may comprise any number of interleaved circuits ILC greater than one, depending on the respective application and in particular, on the overall current that is to be delivered to load 11. Boost converter circuit 1 further comprises output capacitor 7, output 8, and a digital signal processor (DSP 9; not shown in FIG. 1) for operating the gates $G_1, G_2, \ldots, G_N$ of MOSFET switching devices $S_1, S_2, \ldots, S_N$ as explained in the following.

The general operation of circuit 1 corresponds to that of a typical boost converter. For reasons of clarity, the functionality of one interleaved circuit ILC will be discussed first, followed by a discussion of interleaved operation.

Inductor $L_N$ of circuit $ILC_N$ is charged when the respective MOSFET $S_N$ is in the on state. Once inductor $L_N$ is charged, MOSFET $S_N$ is switched to the off state, so that the only remaining current path is through the flyback diode $D_N$ and load 11, the latter of which is shown in FIG. 1 as a resistance. The voltage increases in view of the increased current from both, the inductance 4 and the the input 2. The energy stored in the inductor $L_N$ during the on state is discharged into the load resistance 11 through diode $D_N$, when the MOSFET $S_N$ is in the off state.

Figure 2:
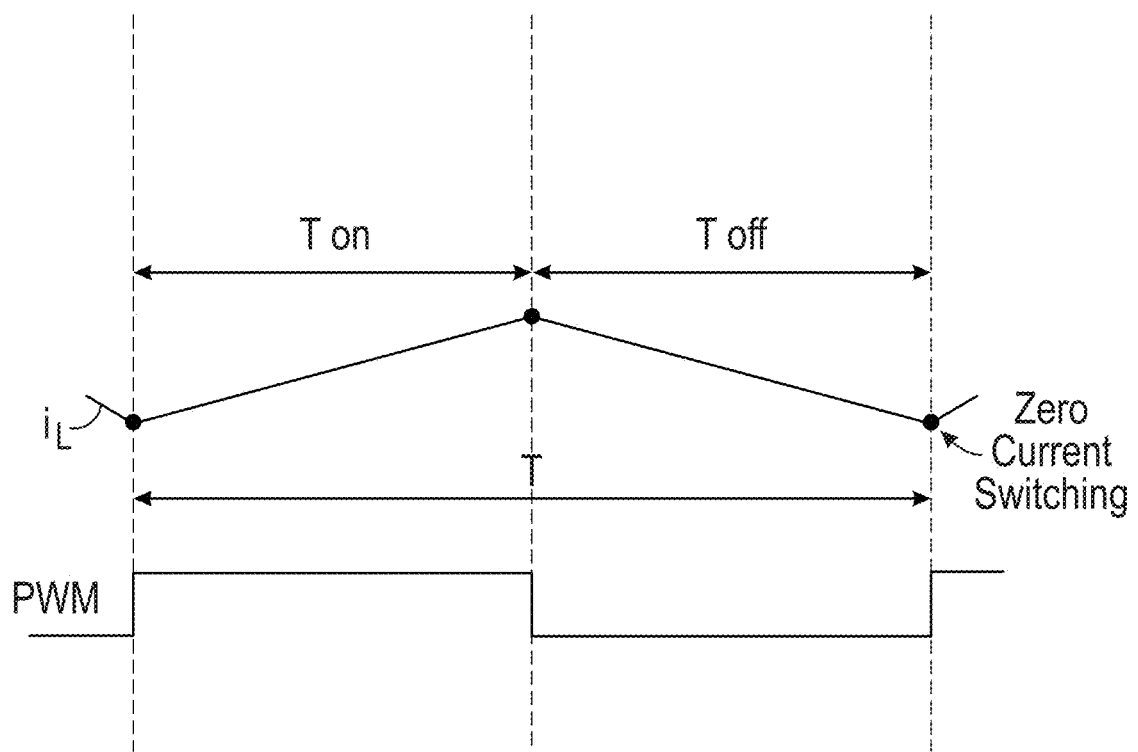
FIG. 2 shows a diagram of the inductor current $I_L$ in an exemplary schematic PWM switching cycle.

In typical BCM operation, a new switching period of the PWM is initiated when the current through the inductor 4, $i_{LN}$, returns to zero. FIG. 2 shows a diagram of the inductor current $i_L$ in an exemplary schematic PWM switching cycle. The rising current slope typically may correspond to $V_{IN}/L$ and the falling current slope may typically correspond to $$\frac{(V_{IN} - V_{OUT})}{L}.$$

As can be seen from the bottom part of FIG. 2, a PWM control signal is applied to MOSFET $S_N$. When the PWM signal is high, MOSFET $S_N$ is conductive and the current $I_{LN}$ in the inductor $L_N$ increases. This time period is described herein as $T_{ON}$ time. Once the desired charge of inductor $L_N$ is reached, the PWM signal is controlled to low and MOSFET 5 is set non-conductive. The current $I_{LN}$ gradually decreases until the inductor $L_N$ is fully discharged. This time period is described herein as $T_{OFF}$ time. Both, $T_{ON}$ and $T_{OFF}$ are a switching cycle T, i.e., in this embodiment, a PWM/switching cycle T.

When the inductor $L_N$ is fully discharged, i.e., at a "zero-current point" in time in the PWM cycle, the next PWM cycle begins. The PWM signal correspondingly is controlled high and MOSFET $S_N$ is switched conductive.

As discussed in the preceding, BCM avoids switching losses in view that the MOSFET $S_N$ is controlled from an off-state to an on-state when no substantial current flows, which is referred to herein as "zero-current switching".

Figure 3:
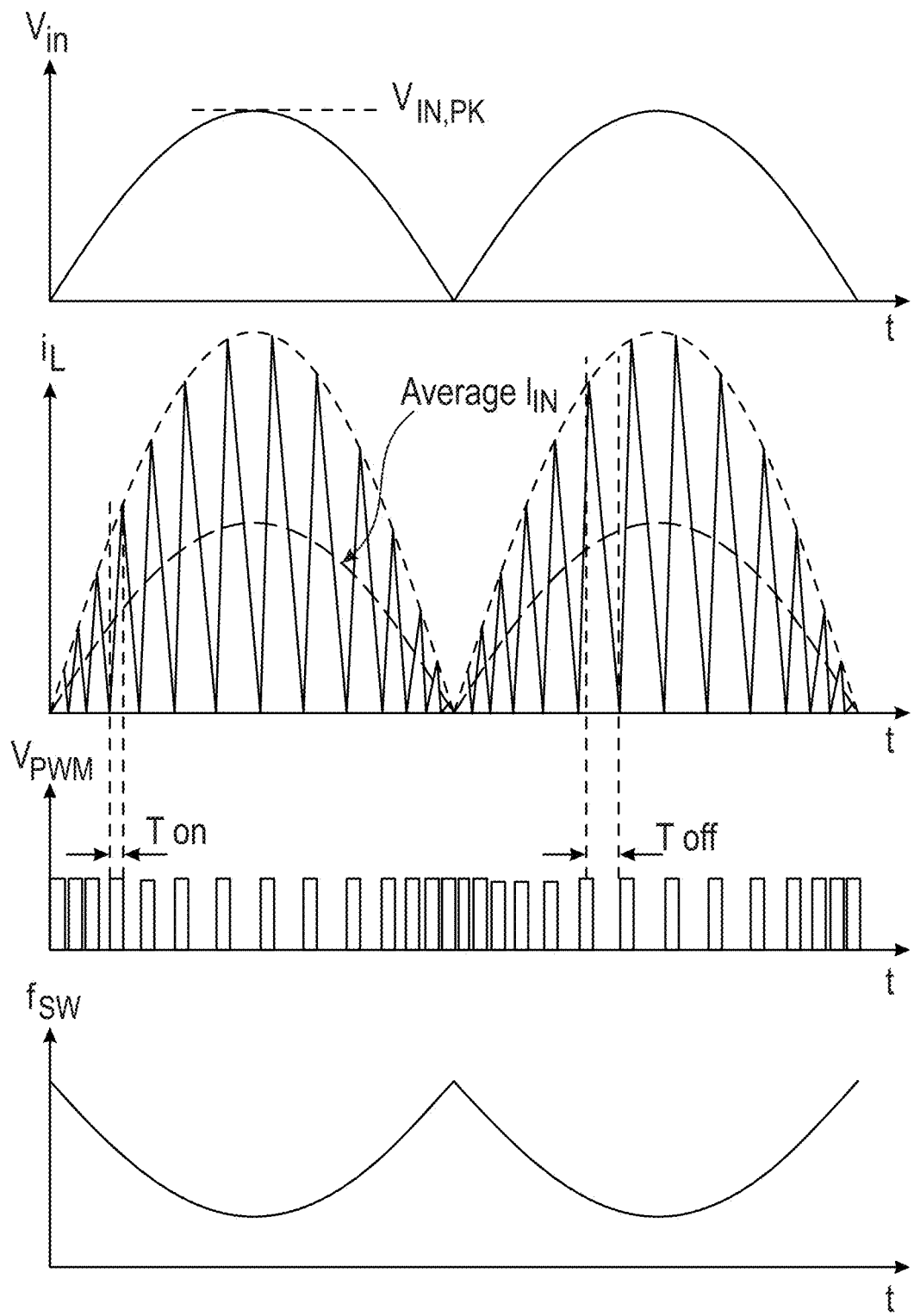
FIG. 3 shows diagrams of the operation of an interleaved circuit $ILC_N$ during a full cycle of an AC input voltage $V_{IN}$.

FIG. 3 shows diagrams of the operation of an interleaved circuit $ILC_N$ during a full cycle of AC input voltage $V_{IN}$. As will be apparent from the FIG., the inductor $L_N$ is charged and discharged multiple times in each half-cycle of the input voltage in accordance with the PWM signal, shown in FIG. 3 as $V_{PWM}$. The converter circuit 1 and more precisely, each interleaved circuit $ILC_N$ operates with a variable switching frequency, which depends primarily on the desired output reference voltage $V_{O, ref}$, the instantaneous value of the input voltage $V_{IN}$, the inductor value of inductor 4, and the output power delivered to the load $R_L$ 11.

The operating frequency changes as the input current follows the sinusoidal input voltage waveform, as shown in FIG. 3. The lowest frequency occurs at the peak of sinusoidal input, i.e., line voltage. As will be apparent from FIG. 3, and since the current waveform of $I_L$ is roughly triangular, the average value in each PWM period is proportional to the input voltage $V_{IN}$. Thus, provided a sinusoidal $V_{IN}$, the input current TIN of the circuit 1 follows the waveform of $V_{IN}$ with high accuracy and draws a sinusoidal input current from the mains. Accordingly, operating the converter 1 in BCM is ideal for power factor correction (PFC).

Figure 4:
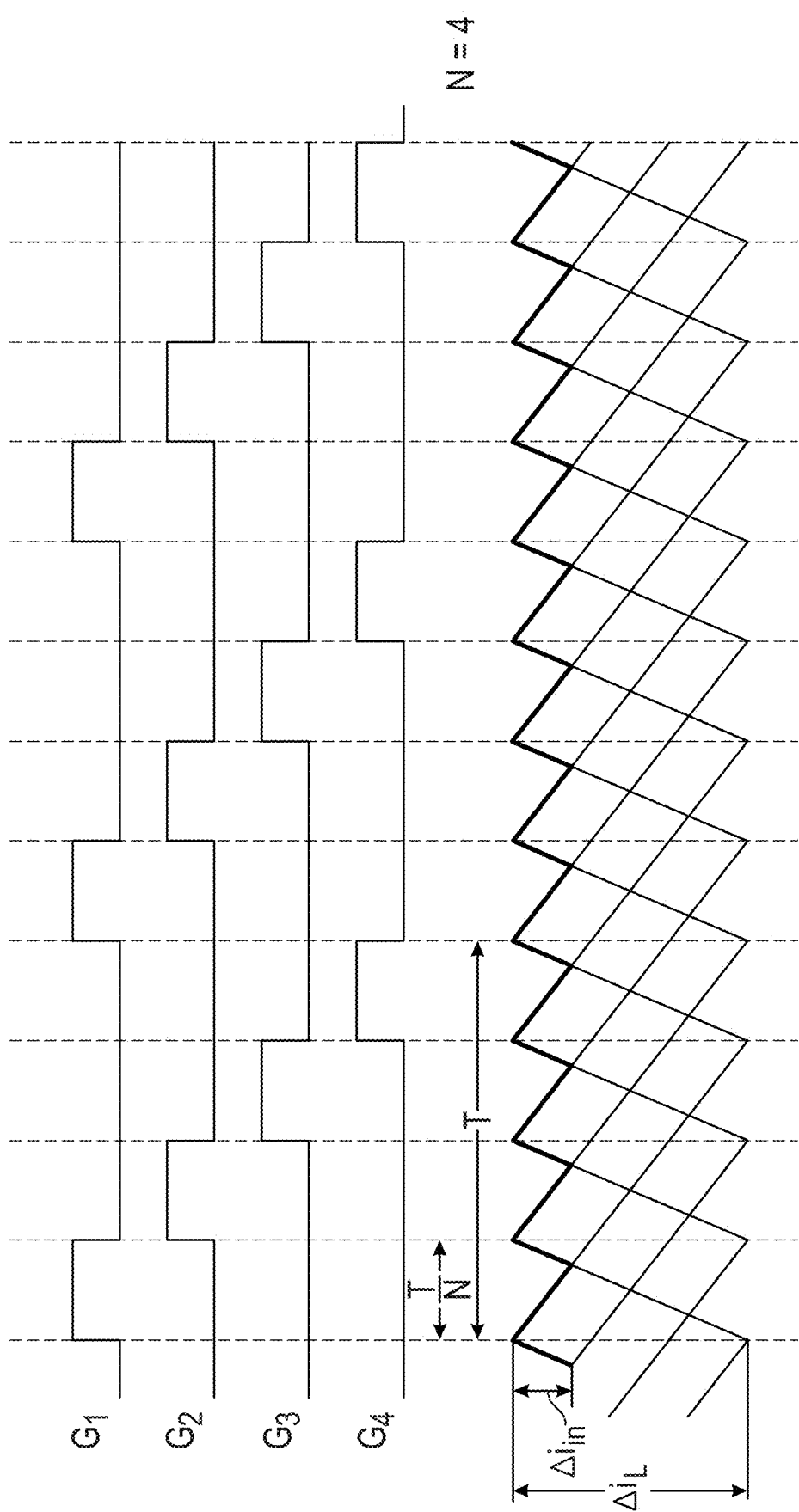
FIG. 4 shows a timing diagram of the interleaved operation of the circuit arrangement of FIG. 1.

While FIGS. 2 and 3 show the operation of each of the interleaved circuit $ILC_N$, FIG. 4 shows a timing diagram of the interleaved operation of a circuit arrangement 1 with an exemplary total number of N=4 interleaved circuits. As will be apparent from FIG. 4, interleaved circuits $ILC_N$, i.e., the gates $G_N$ of corresponding MOSFETS $S_N$ of circuits $ILC_N$ are operated out of phase to reduce a current ripple $\Delta i_{IN}$ at the input 2, which is significantly smaller than $\Delta i_L$, i.e., the maximum difference/span of current $i_L$ of one of the interleaved circuits $ILC_N$.

In the present embodiments, the operation of each secondary interleaved circuit $ILC_N$ is shifted versus the first interleaved circuit $ILC_1$ by $$\frac{(n-1)}{N} * 360,$$

where N is the total number of interleaved circuits and n is an index number of the respective secondary interleaved circuit. It follows that in the example of FIG. 4, $ILC_2$ shows a phase shift of 90°, $ILC_3$ shows a phase shift of 180°, and $ILC_4$ shows a phase shift of 270° to "equalize" or distribute the current draw from input 2 evenly over a given switching cycle T, reducing electromagnetic interference (EMI) effects and thus allows for smaller and more cost-efficient EMI filters.

Figure 5:
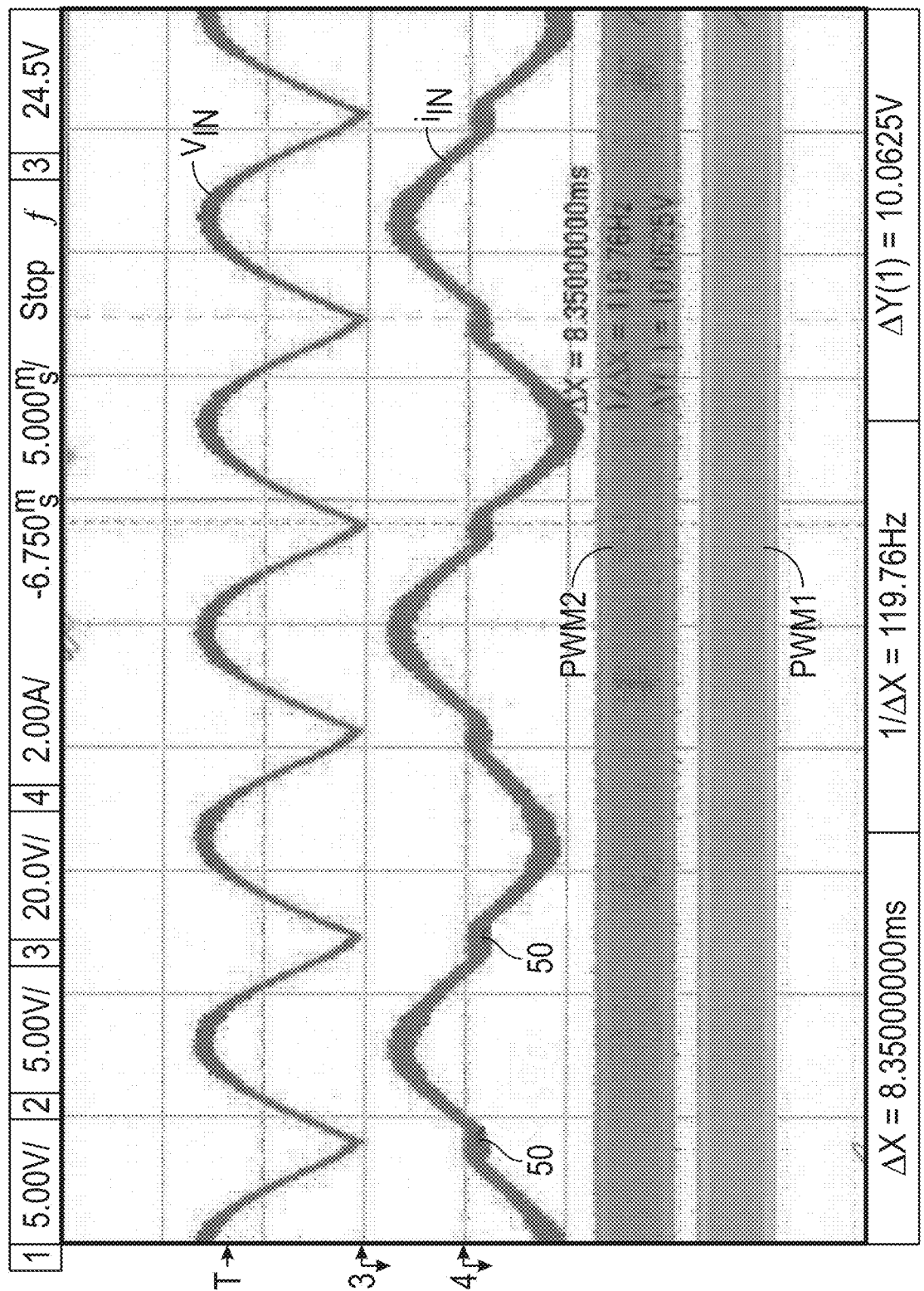
FIG. 5 shows exemplary waveforms of the rectified alternating input voltage $V_{IN}$ as well as the associated input current $I_{IN}$ in a BCM switching power converter circuit arrangement.

As however will also be apparent from FIG. 4, the interleaved operation results in a high frequency current ripple, which is particularly high near the zero-crossings of the alternating input voltage in view of the small voltage levels and the subsequent fast PWM cycles. In view that typical EMI filters attenuate high frequency components, the high frequency current ripple leads to a limited current draw. This results in a zero-current situation being prolonged, leading to a distorted input current waveform and thus, a comparably high THD, as can be seen from FIG. 5, which shows exemplary waveforms of the rectified alternating input voltage $V_{IN}$ as well as the associated input current $I_{IN}$ in a BCM switching power converter circuit arrangment. Reference numeral 50 marks the prolonged zero-current times. The distortion of $I_{IN}$ is readily apparent from FIG. 4.

To counter the above effects, DSP 9 is configured to disable interleaved circuits when the input voltage $V_{IN}$ is falls below predefined voltage thresholds and to simultaneously increase a gain multiplier that sets the on-time $T_{ON}$ and the PWM cycle time T of the remaining, i.e., non-disabled interleaved circuits.

Figure 6:
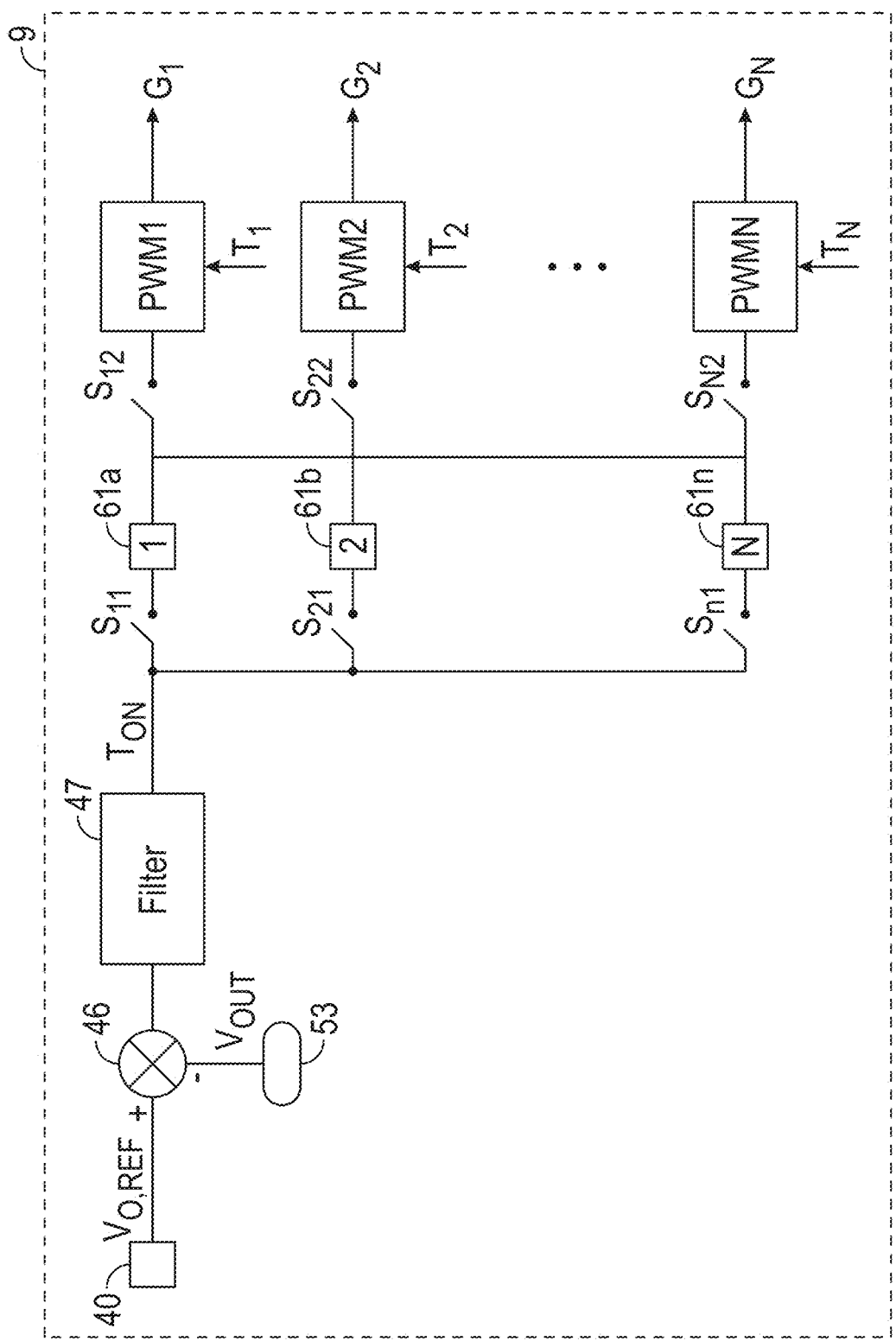
FIG. 6 shows a schematic block diagram of a digital signal processor 9, configured to operate a total of N interleaved circuits $ILC_N$.

FIG. 6 shows a schematic block diagram of a digital signal processor 9, configured to operate a total of N interleaved circuit $ILC_N$. Certainly, the digital signal processor 9 in this case comprises a corresponding number of PWM drive modules $PWM_N$. A voltage signal, corresponding to $V_{OUT}$ is provided to subsequently sampled by the comparators 53. A predefined output voltage reference $V_{O,REF}$ is obtained from memory 40.

Signal processor 9 calculates the on-time for the PWM, $T_{ON}$, from $V_{OUT}$, i.e., the current output voltage and the predefined voltage reference $V_{O,REF}$. Summing node 46 compares the current output voltage $V_{OUT}$ with the "set point" $V_{O,REF}$. The resulting error signal is provided to filter/compensator 47, which runs at a relatively low frequency, e.g., 10 Hz, to remove second harmonic components, typically present in the output voltage $V_{OUT}$.

The resulting signal corresponds to $T_{ON}$ and is provided to a switch matrix, comprising switches $S_{N1}$ and $S_{N2}$. Switches $S_N$ allow to enable and disable the PWM modules and subsequently, the switching device of the respective interleaved circuit. Switches $S_{N1}$ allow to let the $T_{ON}$ signal pass one of N gain multiplier modules 61a-61n. In some implementations, the total time T is processed by the same gain multiplier modules 61a-61n (not shown in FIG. 6).

The resulting operation of DSP 9 is described in the following with reference to FIGS. 7-9, which show various timing diagrams for an exemplary circuit arrangement with four interleaved circuits ILC.

Figure 7:
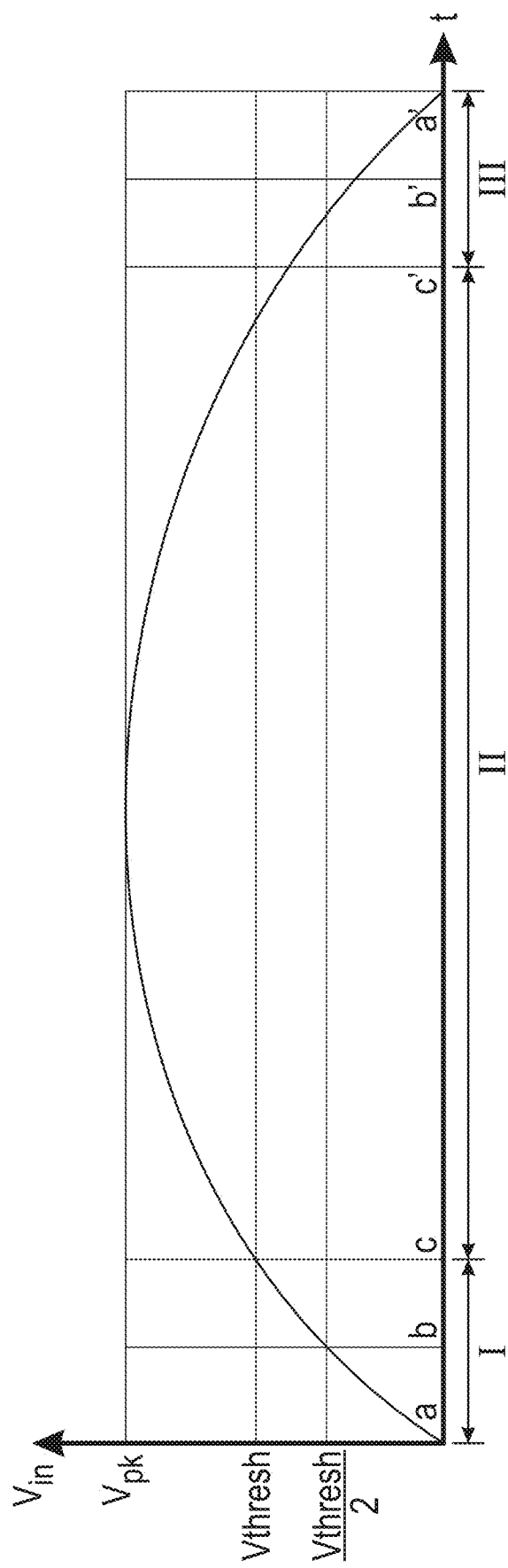
FIG. 7 shows a half-wave of the rectified input voltage $V_{IN}$.

FIG. 7 shows a half-wave of the rectified input voltage $V_{IN}$. As can be seen, two threshold voltages are defined $V_{thresh}$ and $V_{thresh}/2$. The threshold voltage $V_{thresh}$ is based on the power handling capability of individual stage relating to the requirements at the output, so that enough current can be provided at the output at all times. The threshold voltages define switching points, where some of the secondary interleaved circuits are disabled, i.e., when the input voltage $V_{IN}$ falls below the respective threshold. For clarity, the different timing segments have been marked in FIG. 7. Section II describes the time in the half-wave, where the input voltage $V_{IN}$ is higher than the highest threshold voltage $V_{thresh}$. Sections I and III describe the time in the half-wave, where the input voltage $V_{IN}$ is lower than the highest threshold voltage $V_{thresh}$. As will be apparent, subsections ab and b'a' relate to the time in the half-wave, where the input voltage $V_{IN}$ is lower than the lower threshold voltage $V_{thresh}/2$.

When the input voltage $V_{IN}$ is above the threshold voltage $V_{thresh}$, all the interleaved circuits are active and enabled. The output load is effectively shared by all the N converters. The switching "pattern" in this section of the half-wave corresponds to FIG. 4, i.e., normal interleaved operation.

When the input voltage is less than $V_{thresh}$, the total time is divided into log 2(N) subsections as shown in FIG. 7. There are two subsections for the input voltage below $V_{thresh}$ namely ab and b'a'. When the input voltage $V_{IN}$ is rising from zero towards the peak (ascending, section I), the first subsection ab is active. During this time, the first interleaved circuit is active, and the gain multiplicator is 4. Thus, the times T and $T_{ON}$ are four times the nominal times if all interleaved circuits were active. The frequency of the first interleaved circuit is ¼ of the nominal frequency in consequence. All other interleaved circuits are switched off/disabled, and only the first interleaved circuit supplies the load current. The switching PWM waveforms are as shown in FIG. 8.

The operation will continue in this subsection until the input voltage $V_{IN}$ increases beyond $V_{thresh}/2$. When the input voltage $V_{IN}$ is higher than $V_{thresh}/2$, the operation enters subsection bc. During this time, the the first and one of the secondary interleaved converters are controlled operative at twice the period time T and on-time $T_{ON}$, i.e., at half the nominal frequency, while the two remaining secondary interleaved circuits are switched off. The switching PWM waveforms are as shown in FIG. 9. The gain multiplicator is set to 2. It is noted that the two active interleaved circuits are operated in an interleaved way, as can be seen from FIG. 9, and to distribute the on-time periods over the switching cycle T.

When the input voltage $V_{IN}$ exceeds $V_{thresh}$, all the 4 interleaved circuits operate with a gain multiplicator of 1 (section II). The switching PWM waveforms are as shown in FIG. 4.

In the descending section II, when the input voltage falls below $V_{thresh}$, the operation enters subsection c'b'. During this time, the 3rd and $4^{th}$ interleaved circuits are active with a gain multiplicator of 2 and half the nominal switching frequency, i.e., corresponding to FIG. 9, however with the lower two gates $G_3$ and $G_4$ driven instead of gates $G_1$ and $G_2$. When the input voltage falls below $V_{thresh}/2$, the subsection b'a' becomes active. During this time, the interleaved circuit 4 operates with a frequency of ¼ times the nominal frequency and a gain multiplicator of 4, while all other interleaved circuits are disabled.

In the next half-wave of the AC input voltage cycle, and during the subdivision ab, interleaved circuit 2 takes place of interleaved circuit 1, and interleaved circuit 4 takes place of interleaved circuit 4 during subdivision b'a'. The interleaved circuits are interchanged in order to provide uniform stresses to all the interleaved circuits thereby increasing reliability. The switching sequence for N=4 is provided in Table I below.

TABLE I

| AC Cycle | Section | Subsection | Active interleaved circuits | Gain | Frequency |
|---|---|---|---|---|---|
| Positive | I | ab | 1 | 4 | Fsw/4 |
| Positive | I | bc | 1, 2 | 2 | Fsw/2 |
| Positive | II | cc' | 1, 2, 3, 4 | 1 | Fsw |
| Positive | III | c'b' | 3, 4 | 2 | Fsw/2 |

TABLE I-continued

| AC Cycle | Section | Subsection | Active interleaved circuits | Gain | Frequency |
|---|---|---|---|---|---|
| Positive | III | b'a' | 4 | 4 | Fsw/4 |
| Negative | I | ab | 2 | 4 | Fsw/4 |
| Negative | I | bc | 1, 2 | 2 | Fsw/2 |
| Negative | II | cc' | 1, 2, 3, 4 | 1 | Fsw |
| Negative | III | c'b' | 3, 4 | 2 | Fsw/2 |
| Negative | III | b'a' | 3 | 4 | Fsw/4 |

Figure 10:
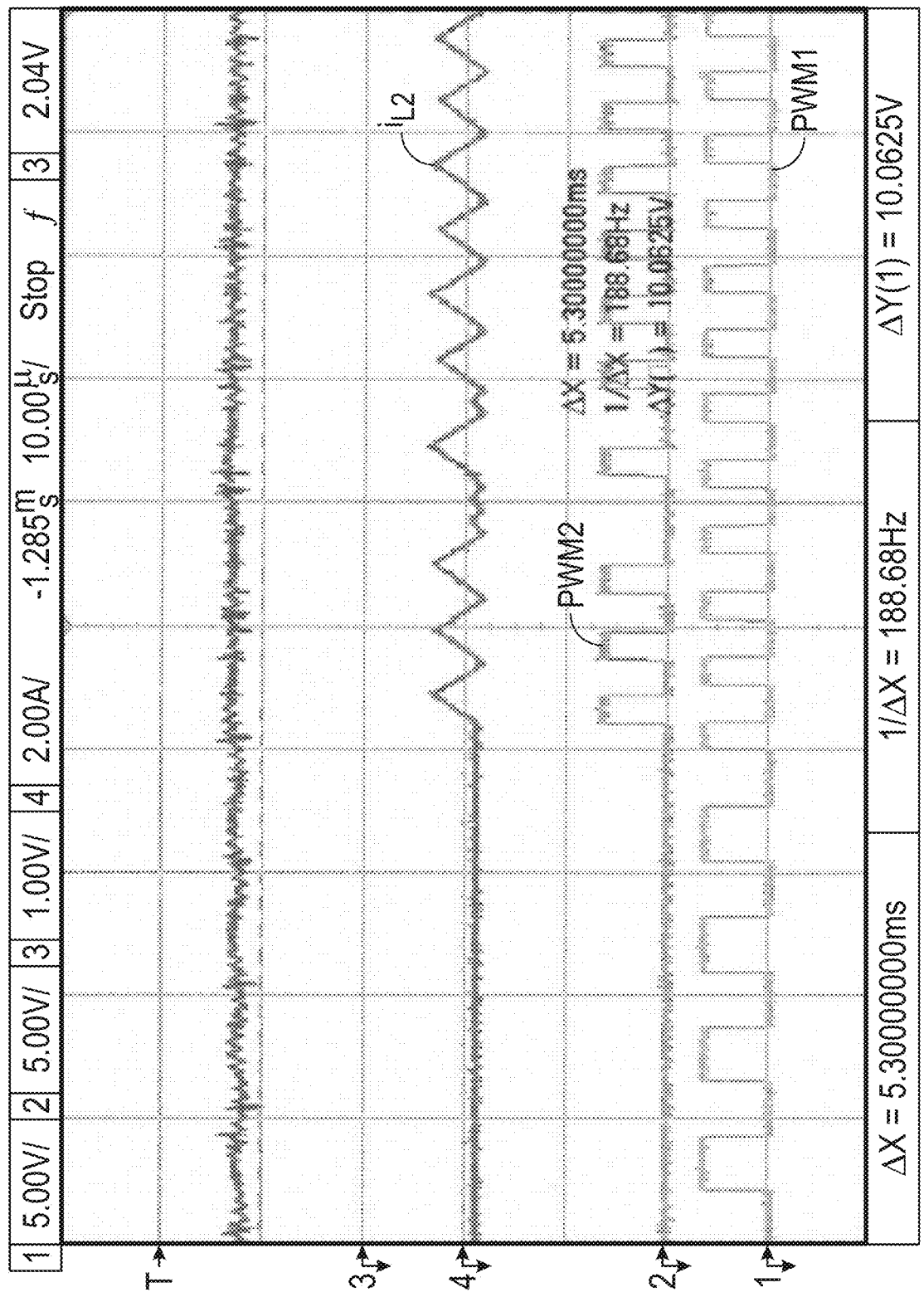
FIGS. 10-12 show waveform plots during the sections of the half-wave as discussed with reference to FIG. 7.
Figure 11:
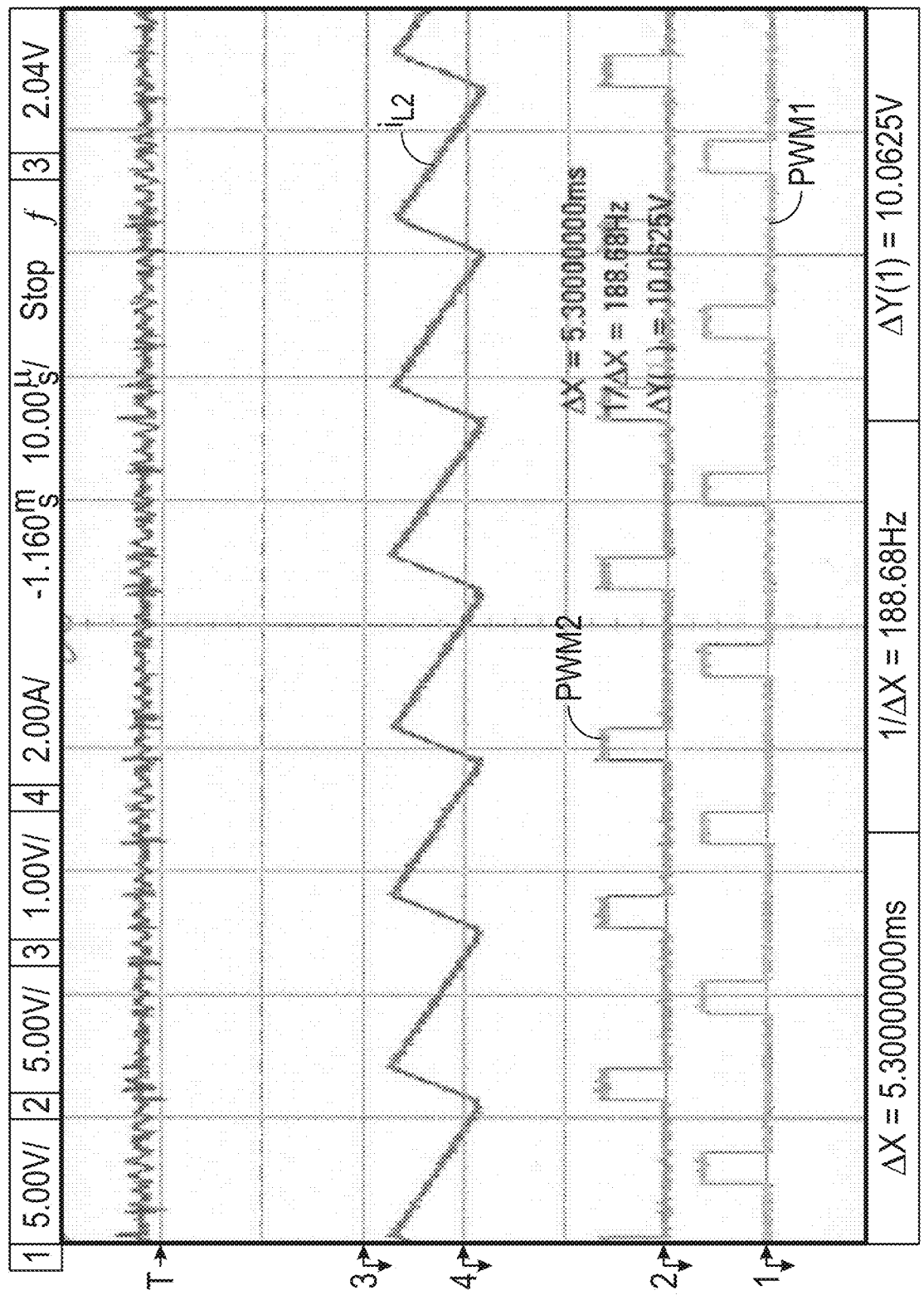
Figure 12:
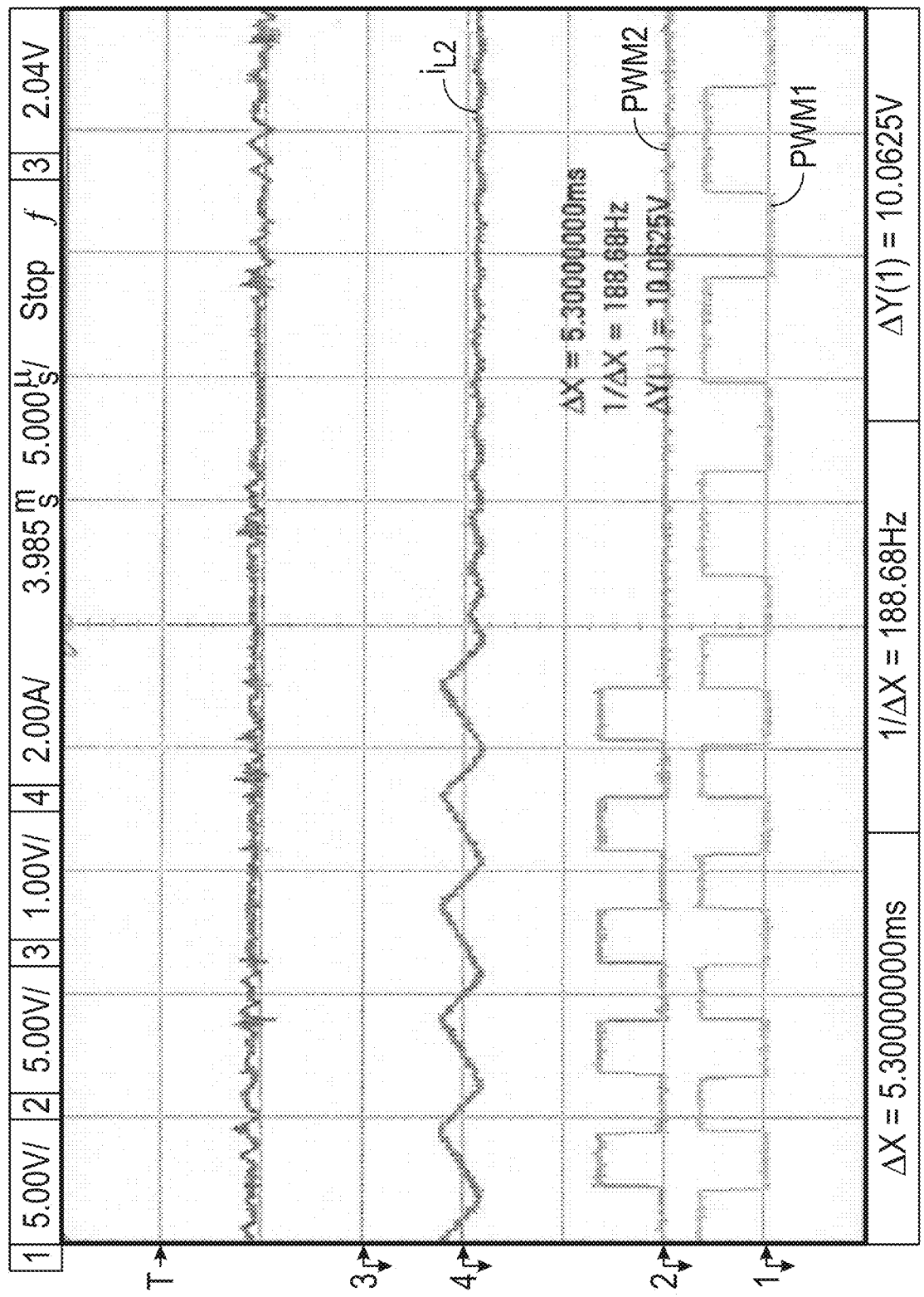

FIGS. 10-12 show waveform plots during the sections of the half-wave as discussed in the preceding. It is noted, that the switching of only two interleaved circuits is shown for clarity, labeled "PWM1" and "PWM2". FIG. 10 shows the transition from a zero-crossing in section I. FIG. 11 shows the signals at peak of the alternating input voltage, i.e., in section II, while FIG. 11 shows the transition from peak to the next zero-crossing in section III.

Figure 13:
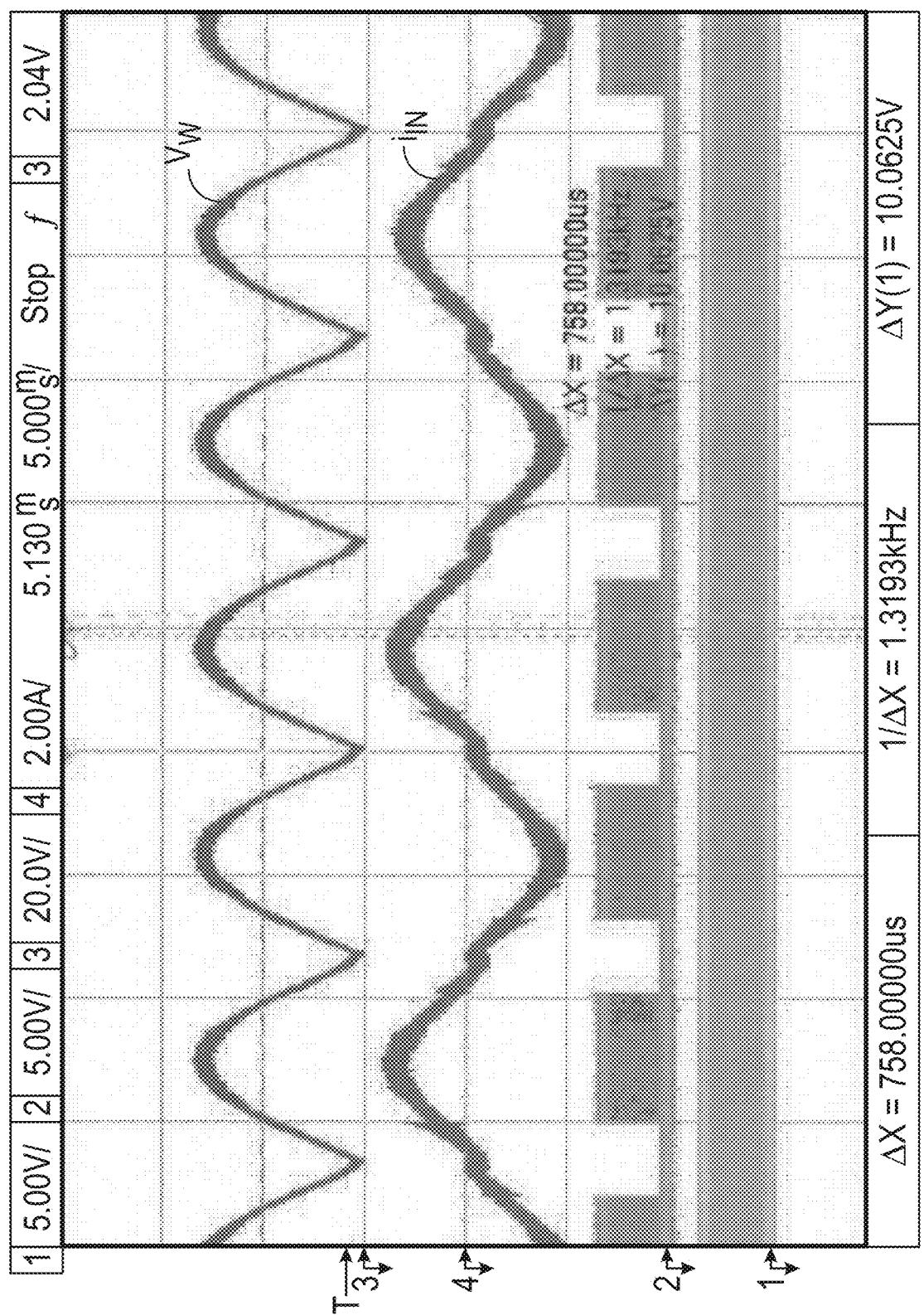
FIG. 13 shows the waveform of the input current when a DSP operates as discussed with reference to FIGS. 7-12.

FIG. 13 shows the waveform of the input current when the DSP operates as discussed in the preceding, namely with the disabling pattern described. When comparing FIG. 13 with FIG. 5, it will be apparent that the input current ills is much smoother, compared to FIG. 5 and in particular, the waveform does not comprise the prolonged zero-times 50.

As the inventors have ascertained, the THD can thus be reduced substantially. Experiments have shown that when operating the invention, THD corresponds to 10.22% without correction and 6.92% with correction.

Figure 14:
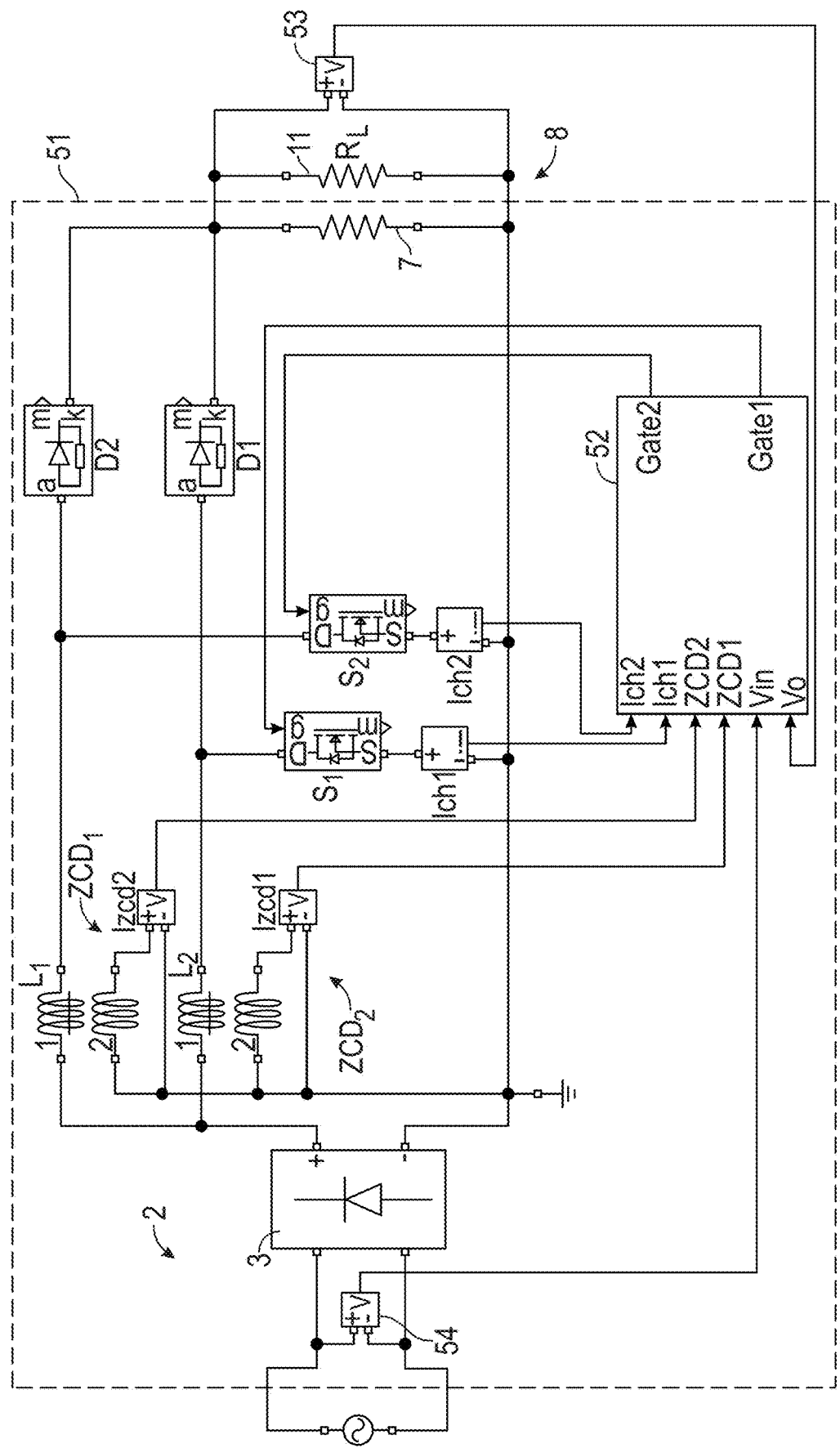
FIG. 14 shows a further embodiment of a circuit arrangement for interleaved switched boundary mode power conversion.

FIG. 14 shows a further embodiment of a circuit arrangement 51 for interleaved switched boundary mode power conversion. The circuit arrangement 51 corresponds to the circuit arrangement 1 with the following exceptions. First, circuit arrangement 51 only comprises a first interleaved circuit $ILC_1$ and a second interleaved circuit $ILC_2$, i.e., a two-stage setup. It is noted that FIG. 14 only shows two stages for clarity. Certainly, more than two-stages are possible in corresponding alternative embodiments.

Each interleaved circuit, in addition to inductor $L_N$, MOSFET switching device $S_N$, and flyback diode $D_N$, comprises a current sensor $ZCD_N$, comprising a secondary inductor, inductively coupled to the respective inductor $L_N$, as well as an associated comparator $IZCD_N$. Current sensors $ZCD_N$ are connected to digital signal processor 52 to allow zero-current switching operation. Two further comparators $I_{CH1}$ and $I_{CH2}$ are provided to determine the current through the respective MOSFET $S_1$ and $S_2$. Further comparators 54 and 53 are arranged to determine the input voltage $V_{IN}$ and $V_{OUT}$, respectively. DSP 52 in the present embodiment is of dsPIC33EP series type, available from Microchip Technology Inc., Chandler, Ariz., USA.

Digital signal processor 52 may be operated in different operating modes. In the following, an exemplary "phase update mode" is discussed with reference to the timing diagram of FIG. 20.

In this embodiment, digital signal processor 52 determines the parameters for PWM operation of the two MOSFETs $S_1$ and $S_2$. DSP 52 correspondingly comprises at least two internal PWM drive modules, configured in current reset mode.

In particular, current sensors $ZCD_N$ provide the instant time in each PWM cycle, where the current through the respective inductor $L_N$ reaches zero, which is used as a current reset trigger and thus to restart a new PWM cycle in current reset mode operation.

The desired on-time of the two MOSFETs $S_1$ and $S_2$ is determined from the current voltage $V_{OUT}$ at output 8 and comparator 53 and a reference voltage $V_{O,REF}$ that is predefined in internal memory of the DSP 52 by the manufacturer or the user of DSP 52. $V_{O,REF}$ corresponds to the desired voltage at output 8, applied to load 11. It is noted that the on-time of MOSFET $S_1$ is set to correspond to the on-time of MOSFET $S_2$ in every PWM cycle.

In addition to the above, the total PWM cycle time T is determined from the preceding PWM cycle. While doing so provides a one-cycle delay in the cycle time T, the resulting error is comparably small, even considering the changing frequency of the switching operation, as discussed in the preceding with reference to FIG. 3. To determine the PWM cycle time T, the DSP 52 is programmed to determine the elapsed time between the latest two rising edges of the PWM signal, that is provided to MOSFET $S_1$, i.e., the PWM signal, applied to the first interleaved circuit. Alternatively, the PWM cycle may be sampled using an "input capture" pin of the DSP 52, should the latter be present with the respective type of DSP 52 used.

Figure 20:
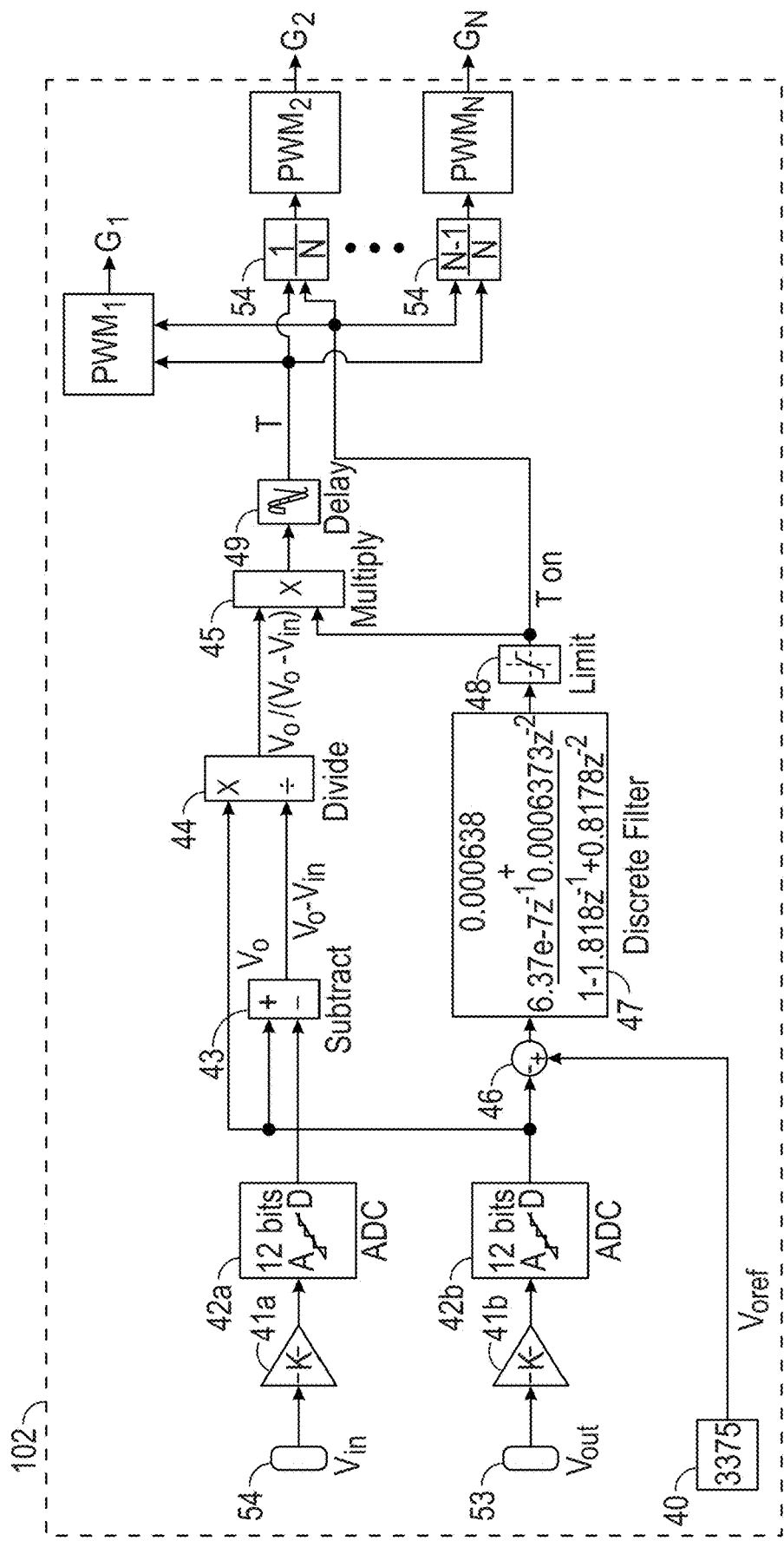
FIG. 20 shows a more detailed schematic block diagram of the embodiment of FIG. 19.

With reference to the timing diagram of FIG. 20 and as shown, both interleaved circuits and more precisely MOSFETs $S_1$ and $S_2$ are operated with PWM signals. In FIG. 20, "PWM1" refers to the PWM signal, applied to MOSFET $S_1$ and "PWM2" refers to the PWM signal, applied to MOSFET $S_2$. $I_1$ and $I_2$ refer to the currents through inductors $L_1$ and $L_2$, respectively.

Both MOSFETs are driven with the same-on time in each PWM switching cycle, which allows zero-current switching and thus operation in BCM mode. PWM2 is phase shifted compared to PWM1 by half a PWM cycle, i.e., T/2, for a fully interleaved operation. The phase of PWM2 is set at the start of each switching cycle of PWM1. An alignment/update of the zero-current instant and the cycle time T is conducted at the end of each cycle, if there is any difference in the instant of the zero-current instant and phase, which can occur during short transient conditions.

Figure 15:
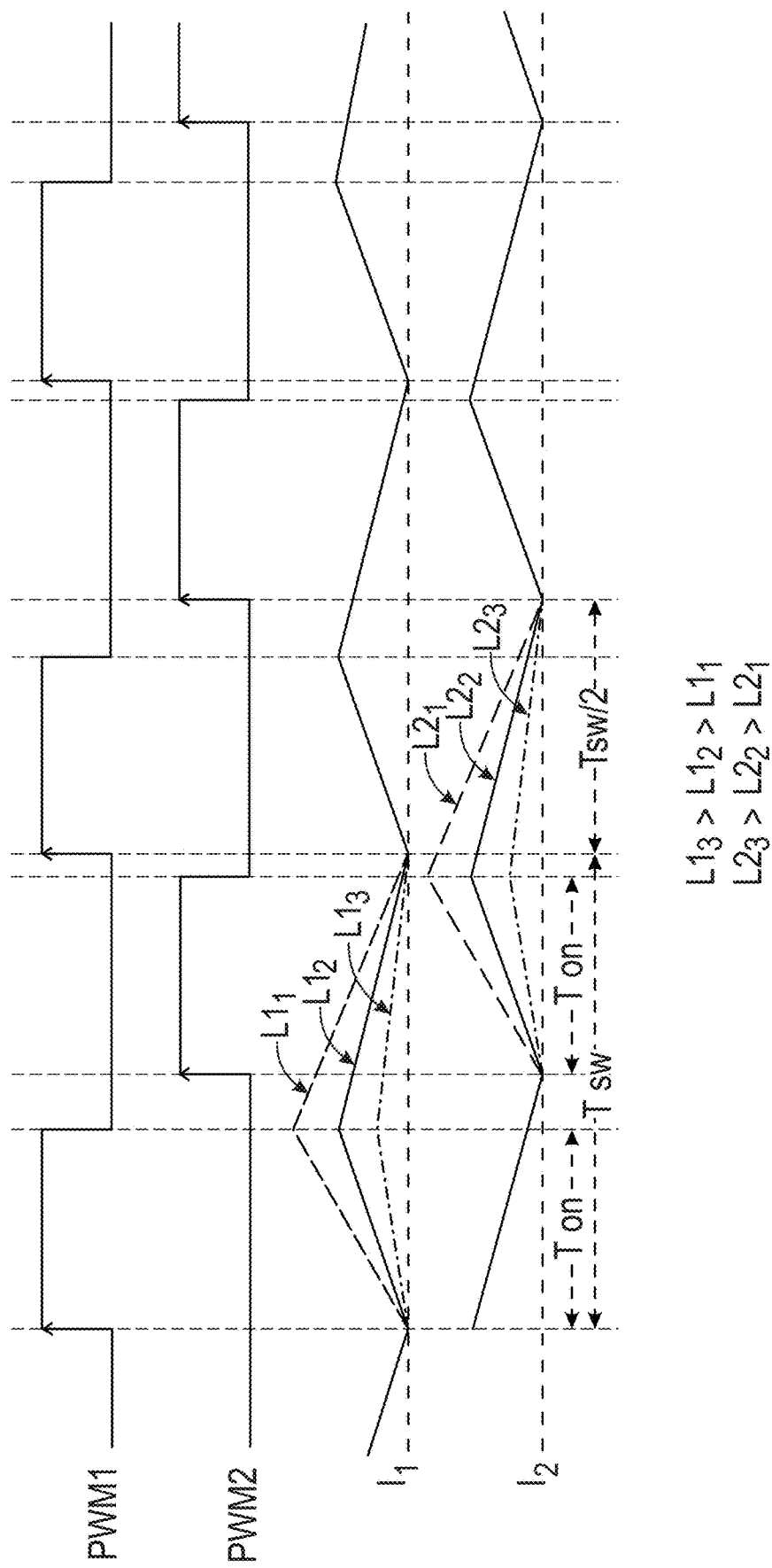
FIG. 15 shows a timing diagram related to the embodiment of FIG. 14.

FIG. 15 shows the resulting currents $I_1$ and $I_2$ for multiple inductances. As the current inventors have determined, differing inductances between the different interleaved circuits only has a negligible effect on the timing, so that slight variations in the inductances have only little effect on the timing when operating as discussed herein. It is noted however, that the power shared by the current in a given stage is inversely proportional to the value of the stage inductance, so that in some embodiments, identical inductances are used in all interleaved circuits.

As discussed in the preceding with reference to timing chart FIG. 15, the discussed interleaved BCM operation requires setting the phase of the secondary interleaved circuit in every PWM cycle, in particular in view of the changing switching frequency in boundary conduction mode. In view that some commercially available digital signal processors do not allow a phase update when operating in current reset mode, a corresponding further embodiment for the operation of the digital signal processor 52 of FIG. 14 is discussed in the following with reference to the block diagram of FIG. 16 and the timing diagram of FIG. 17, also referred to as "PWM synchronization mode". Both operating modes of digital signal processor 52, i.e., the operation discussed in the preceding with reference to FIG. 15 and the operation discussed in the following with reference to FIGS. 16 and 17 may be realized in software and/or hardware, wherein the software may be comprised in an internal memory (not shown) of digital signal processor 52. While the DSP 52 may comprise software for both operating modes, so that the desired mode can be set during operation, it is certainly sufficient, when one operating mode is provided, depending on the capabilities of the type of DSP used.

Figure 16:
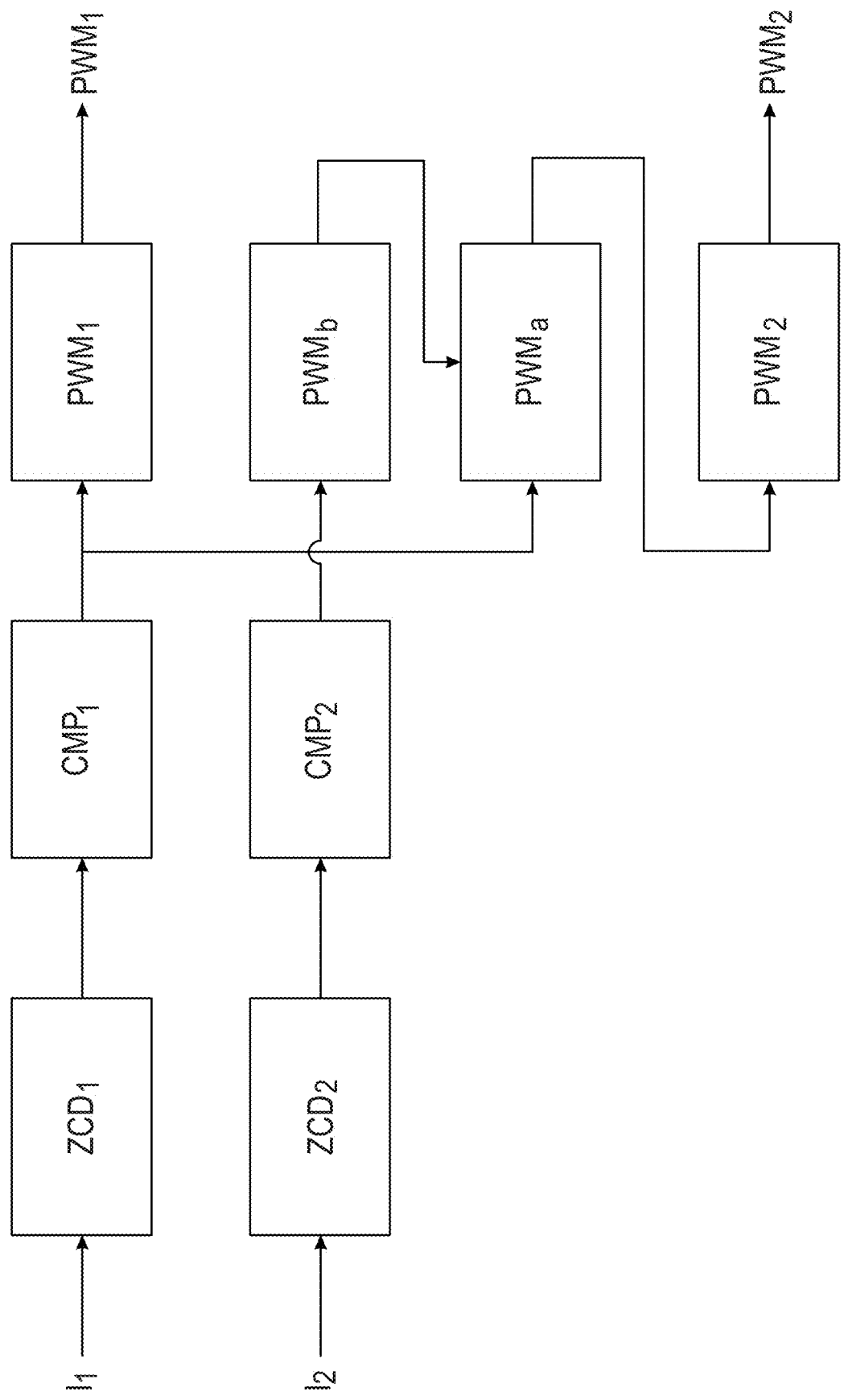
FIG. 16 shows a block diagram of a signal processor as used in the embodiment of FIG. 14.
Figure 17:
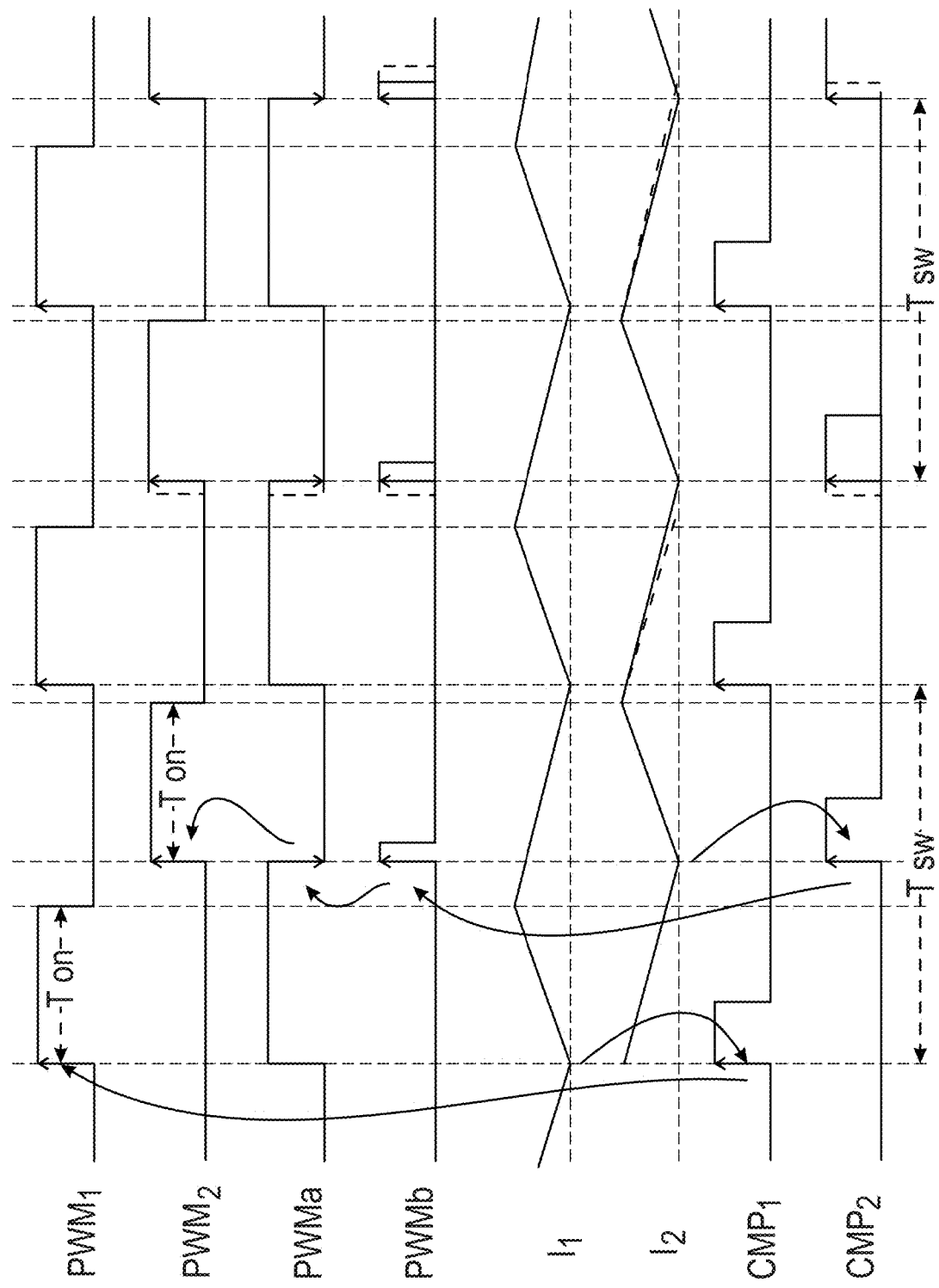
FIG. 17 shows a timing diagram related to the embodiment of FIG. 14.

As will be apparent from FIG. 16, the current embodiment uses two "intermediate" PWM modules, namely PWMa and PWMb to obtain PWM2 for controlling the secondary interleaved circuit and MOSFET $S_2$. It is noted that all PWM modules according to this embodiment are operated in current reset mode.

PWM1 is generated as discussed in the preceding with reference to FIG. 15, namely based on the zero-current point, determined by $ZCD_1$. Based on the detected zero-current point, comparator circuit $CMP_1$ generates a pulse to start or restart (reset) a PWM cycle for signal PWM1. Corresponding to the preceding operating mode, the desired on-time of the two MOSFETs $S_1$ and $S_2$ is determined from the current voltage $V_{OUT}$ at output 8 and comparator 53 and the reference voltage $V_{REF}$. The total PWM cycle time T is determined from the preceding PWM cycle, as discussed. It is noted that all comparator circuits $CMP_N$ are peripherals of the DSP.

With respect to the generation of PWM2, intermediate PWMb signal is generated from the determined zero-current point of the secondary interleaved circuit, as determined by the zero-current sensor $ZCD_2$, and a corresponding start or restart pulse, generated by comparator circuit $CMP_2$. The PWMb signal thus starts a new cycle upon the determined zero-current point and thus determines the instant of the zero-current point. The PWMb signal is provided to a further PWM module for generating PWMa. This PWM module also receives the $CMP_1$ signal, as well as the determined PWM cycle time T. PWMa is started or restarted using the $CMP_1$ pulse, corresponding to a zero-current point of the first interleaved circuit. PWMa is programmed with a duty cycle T/2, i.e., half of the PWM cycle time of the first interleaved circuit. PWMb is used to truncate PWMa at the zero-current point of the secondary interleaved circuit, as shown in the timing diagram of FIG. 17.

The PWMa signal is provided to a fourth PWM module of DSP 52 to provide PWM2 to the MOSFET $S_2$ of the secondary interleaved circuit, using a falling edge of PWMa to trigger a start or restart of a PWMb cycle. The on-time of PWMb is set to correspond to the on-time of PWMa.

In this embodiment, the comparators $CMP_1$ and $CMP_2$ also allow to add a control delay for the switching of MOSFETS $S_1$ and $S_2$. Such a delay may be useful in view that considering typical parasitic capacitances, in particular of MOSFETS $S_1$ and $S_2$, the actual zero moment of the inductors may not ideal for the switching in view the voltage across the parasitic capacitance of the of MOSFETS $S_1$ and $S_2$ in this case would discharge through the of MOSFETS $S_1$ and $S_2$. To counter this loss, a delay may be introduced. The delay time is predefined, based on the parasitic capacitance value. Typical delay times range between 100 nanoseconds and 400 nanoseconds. It is noted that in view of the rather small delay introduced in the switching of MOSFETS $S_1$ and $S_2$, the delayed switching points are still considered as zero-current points herein.

Figure 18:
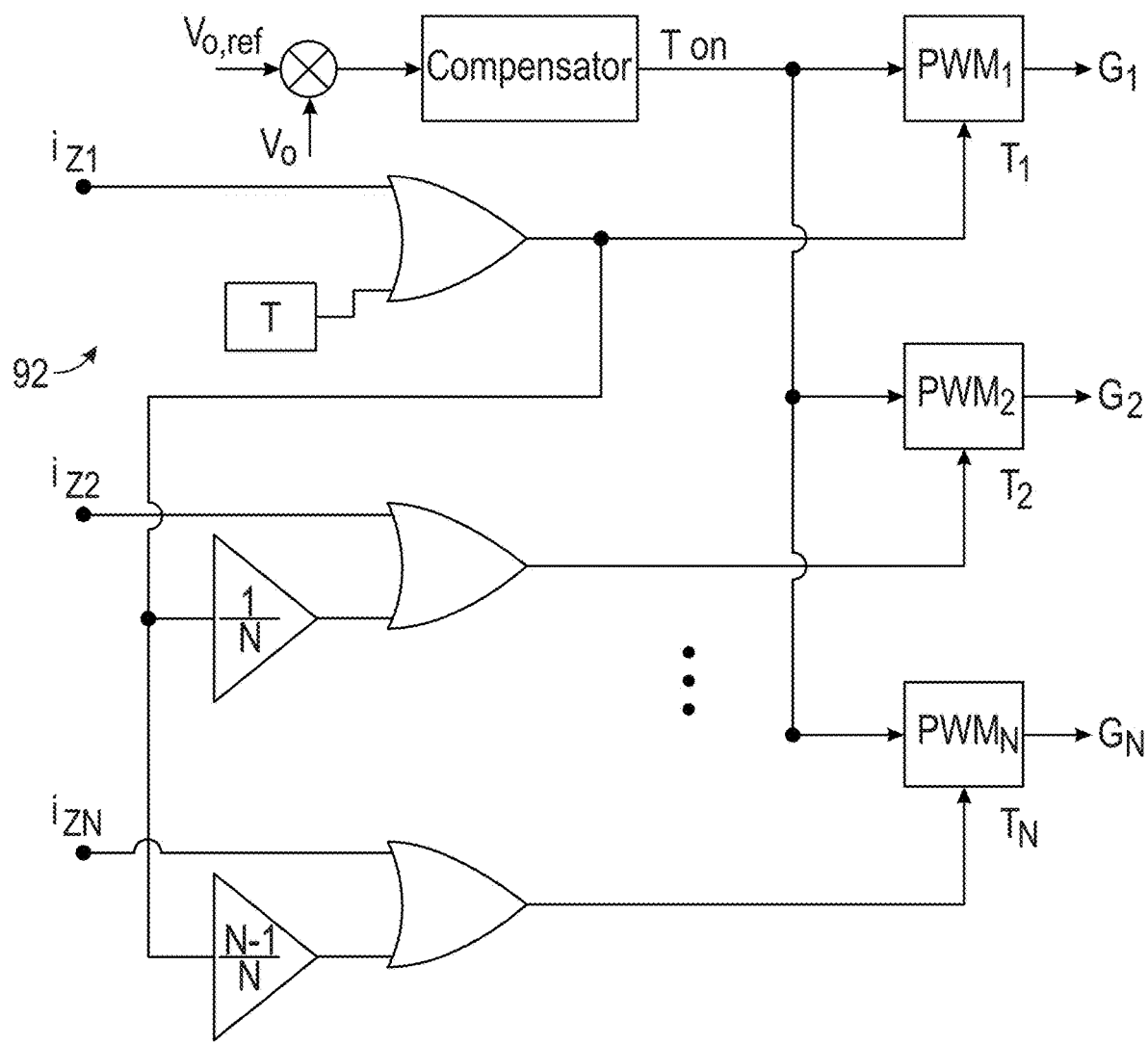
FIGS. 18 and 19 shows schematic block diagrams of further embodiments of a signal processor.

FIG. 18 shows a schematic block diagram of a digital signal processor 92, operating according to the preceding operating modes for a total of N interleaved circuit $ILC_N$. Certainly, the digital signal processor 72 in this case comprises a corresponding number of PWM drive modules.

Figure 19:
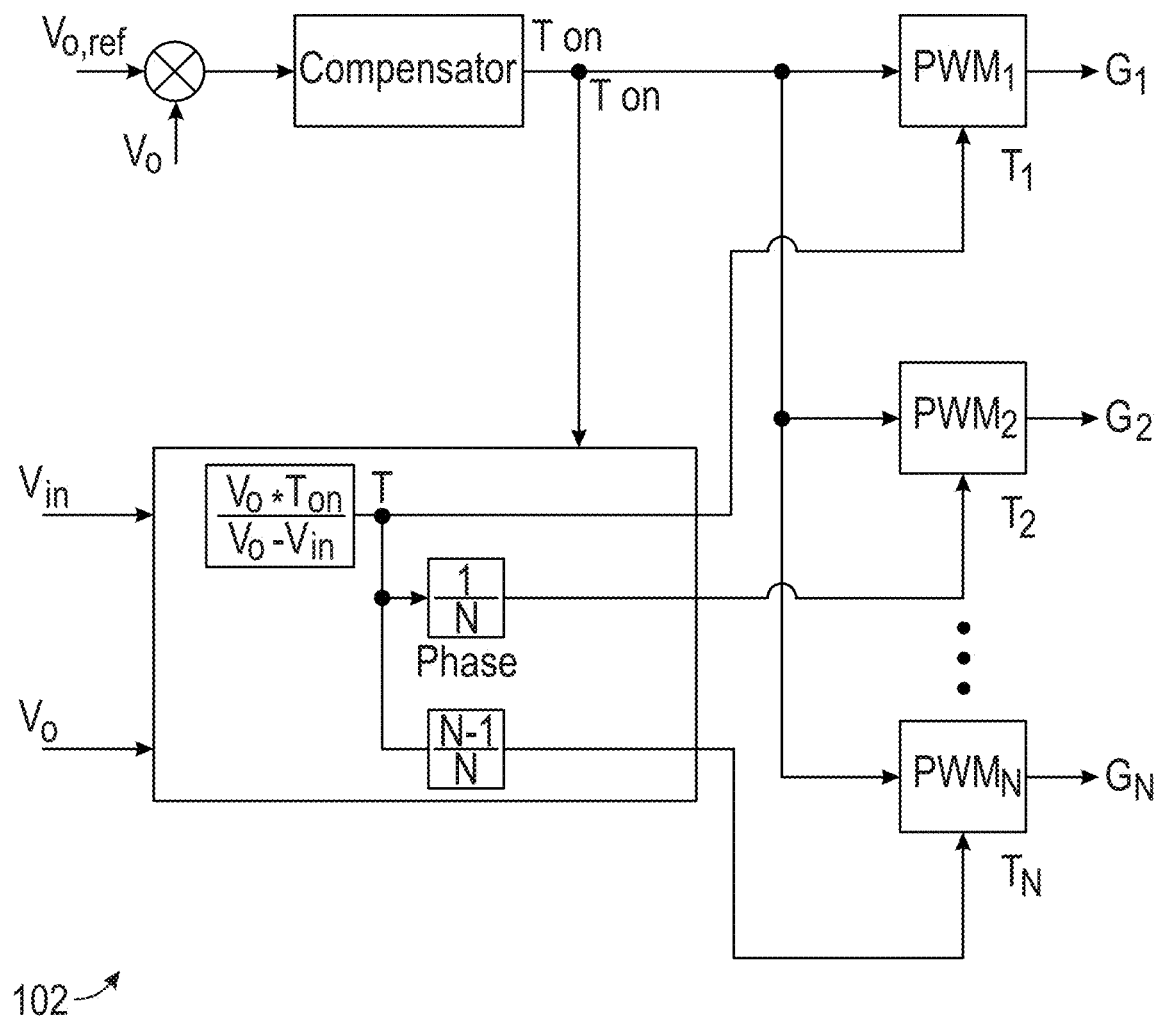

FIG. 19 shows a further embodiment of a digital signal processor 102 in a schematic block diagram. As can be seem from the FIG., the present embodiment uses the voltages $V_{IN}$, $V_{OUT}$, and $V_{REF}$ to control the PWM operation, without a current measurement being necessary. Accordingly, current sensors $ZCD_N$ can be omitted herein, thus reducing the cost and size of the overall setup.

Using the two voltage signals, corresponding to $V_{IN}$ and $V_{OUT}$, as well as a predefined voltage reference $V_{O,REF}$, provided again by an internal memory (not shown) of digital signal processor 102, the digital signal processor 102 calculates the zero-current points in each PWM cycle, i.e., the points in time, where the inductor currents $i_{LN}$ respectively reaches zero.

The signal processor 102 in the present embodiment is a digital signal processor of dsPIC33 series type.

FIG. 20 shows a more detailed schematic block diagram of the embodiment of FIG. 19.

The first (corresponding to $V_{IN}$) and second (corr. to $V_{OUT}$) voltage signals are received at and subsequently sampled by the respective comparators 54 and 53 (see FIG. 19). The predefined voltage reference $V_{O,REF}$ is obtained from memory 40.

Signal processor 102 is configured to sample the voltage signals at T/2 when the duty cycle of the PWM is lower than 50%, i.e., when $V_{IN} > V_{OUT}/2$ to $V_{IN,PEAK}$. This provides that the period corresponds to the average of the input voltage. The bulk of the power transfer occurs during this interval. Since the duty cycle and the frequency are low in this case, there is adequate time for calculating the next zero-current point and the switching period.

For the remainder of the input voltage half-wave, the sampling frequency goes higher towards the zero-current point and there is no adequate time for computation if sampling would be done at T/2. Instead, for a duty cycle of equal to or higher than 50%, the signal processor 9 is configured to sample the voltage signals near the start of the cycle, for example after a small delay of 20 ns for switching transients to die down. Since the input voltage is small compared to its peak, the difference between the values sampled at start and T/2 is not significant The two voltage signals are provided to operational amplifiers 41a, 41b for signal conditioning and then provided to analog-to-digital (ADC) circuits 42a, 42b. The two ADC circuits 42a, 42b convert the voltage signals to digital information and are of 12 bit type with a Vmin: 0V and a Vmax: 3.3V.

Signal processor 102 further comprises multiple modules to provide the total PWM cycle time T and the on-time $T_{ON}$ to the PWM modules $PWM_N$. As shown in the upper part of FIG. 20, subtraction module 43 and division module 44 provide $$\frac{V_{OUT}}{(V_{OUT} - V_{IN})}$$

to multiplication module 45. The upper path, shown in FIG. 20, is a high frequency execution path to compute the PWM period value, operating at a maximum frequency in this embodiment of 500 kHz.

In the lower part of FIG. 20, the on-time for the PWM, $T_{ON}$, is calculated from $V_{OUT}$, i.e., the current output voltage and the predefined voltage reference $V_{O,REF}$. Summing node 46 compares the current output voltage $V_{OUT}$ with the "set point" $V_{O,REF}$. The resulting error signal is provided to filter/compensator 47, which runs at a relatively low frequency, e.g., 10 Hz, to remove second harmonic components, typically present in the output voltage $V_{OUT}$.

The filtered error signal is provided to limiter 48. The limiter 48 provides safety, in particular in a load side short circuit situation. During a short circuit on the output/load side, the ON time of MOSFETs $S_N$ tend to go higher. Limiter 48 limits the maximum on time $T_{ON}$, and thus the maximum power, fed to the output. Accordingly, a short circuit situation is safely handled. If both, the input voltage and the on-time are within limits, an over power condition does not arise.

Multiplier 45 receives the correspondingly processed error signal as on-time $T_{ON}$ and correspondingly provides $$\frac{V_{OUT}}{(V_{OUT} - V_{IN})} \times T_{ON}$$

to delay 49 and subsequently to PWM modules $PWM_1$ as total PWM period time T. The phase of the remaining PWM modules is calculated based on the PWM period time T through a respective phase shift module 54.

$T_{ON}$ is also directly provided to the PWM modules $PWM_N$. Using T and $T_{ON}$, each PWM module can apply the appropriate PWM timing settings to the respective gates $G_N$ of MOSFETs $S_N$. In view that the calculation is based upon $V_{OUT}$ and $V_{IN}$, the zero-current point in each PWM cycle reliably determined.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment in which:

- instead of or in addition to inductor 4, a capacitor is used as an energy storage device;
- an EMI (electromagnetic interference) filter is included and designed to pass lower frequency components and attenuate the higher frequency components;
- filter/compensator 47 is a 2P2Z or a PID controller; and/or instead of current sensor $ZCD_N$ comprising a coupled inductor, current sensor $ZCD_N$ comprises a CT or Hall Effect sensor, or a sensing resistor for inductor current measurement and/or diode current measurement.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module, or other unit may fulfill the functions of several items recited in the claims.

The mere fact that certain measures are recited in mutually different dependent claims does not indicate that a combination of these measured cannot be used to advantage. Any reference signs in the claims should not be construed as limiting the scope.

APPENDIX

The present disclosure relates to power supplies and, more particularly, to digital control of interleaved boundary mode power factor correction (PFC) for reduced crossover distortion Embodiments of the present disclosure include microcontrollers, systems, integrated circuit devices, and methods for digital control of interleaved boundary mode PFC for reduced crossover distortion. Such PFC may be implemented by any suitable combination of analog circuitry, digital circuitry, instructions for execution by a processor, or combination thereof. Embodiments of the present disclosure may further be implemented in power supplies or controllers for power supplies.

FIG. 1 is an illustration of an example circuit for implementing control of interleaved boundary mode power factor correction (PFC) for reduced crossover distortion.

Boundary mode PFC may include a variable frequency topology wherein the switching frequency is varying over an alternating current (AC) line cycle. The variable frequency may be due to zero-inductor-current PWM switching. The frequency may be primarily dependent on the input voltage, output load, and inductor value. The frequency may be highest near the input voltage zero and lowest near the input voltage peak. An EMI filter may be included and designed to pass lower frequency components and attenuate the higher frequency components. For a fixed load, the higher frequency components near the zero crossing may get attenuated. This may result in the input current distortion near the zero crossing and will lead to lower total harmonic distortion (THD) numbers.

Boundary mode PFC may also include a boost topology, AC input, direct current (DC) output, a single voltage loop, constant ON time, a switch to be turned off at zero current, and, as mentioned above, variable frequency. Embodiments of the present disclosure may reduce crossover distortion. This may lead to achieving a high power factor and lower THD. The embodiments may be highly efficient and better utilize digital control. Moreover, the embodiments may lead to higher power density, with reduced EMI filter size, smaller packaging, and lower cost.

In FIG. 1, in an interleaved multistage boundary mode PFC, the EMI filter may attenuate high frequency components near the zero crossing of the input voltage waveform. This may result in a prolonged zero current situation near the zero crossing, thereby leading to a distorted current waveform. With high power factor, the input current wave shape may be the same as that of the input voltage. Near zero cross, the input voltage and input current levels may be very low. The input current levels may increase with the input voltage and are highest near the peak of the input voltage. The approach taken to solve this issue may involve reducing the number of stages operating near the zero crossing, thereby operating the converter at an increased frequency. The current ripple may tend to get higher with this approach, but will effectively pass through the EMI filter, thereby reducing the zero crossover time. A sudden change in the number of operating stages can affect the control loop and have stability issues. However by changing the gain based on number of converter stages operating, the control loop may be unaffected.

The PFC may include two or more identical sections of boost converters. The boost converters may include an inductor, switch, and diode. The boost converters may convert AC input voltage to DC output voltage. The boundary mode operation may have advantages of higher efficiency and power factor. One of the drawbacks of this topology is the variation in switching frequency over the line cycle. Towards zero crossing of the AC line cycle, the frequency is highest, while the frequency is lowest at the peak.

In one embodiment, a new PWM switching cycle is synchronized with zero inductor current. The zero inductor current instant can be sensed using, for example, a current sensor or coupled inductor, or determined by calculations. As seen in FIG. 1, the input to the circuit is the AC supply of, for example, 10V at 60 Hz or 230V at 50 Hz. The input voltage may be rectified using a bridge rectifier. Furthermore the input voltage may be subsequently fed to one of the boost circuits. Give, for example, N boost stages or converters, each boost stage may be designed to handle a power of P/N, with adequate margins. The input and output capacitors may be common to all the boost stages, and can be lumped or distributed.

FIG. 3 illustrates example, basic input and output waveforms, according to embodiments of the present disclosure.

The zero switching instant for each stage can be determined by using a coupled inductor or inductor current sensing. In both the cases, a comparator within the dsPIC may receive the sensing signal.

FIG. 6 illustrates an algorithm for the interleaved PFC running inside the dsPIC, according to embodiments of the present disclosure. The dsPIC may compute the ON time using a digital filter and the difference between reference output voltage and the actual output voltage. The bandwidth of the output voltage may be kept low to prevent input current distortion. This may lead to a constant ON time over AC line cycle for a given input voltage and output load. The gating pulse to the switch, which may be implemented as a MOSFET, may be HIGH during the ON time and LOW during the OFF time. The PWM cycle may be restarted when the inductor current goes to zero. The ON time for each PWM module may go through two switches. The first switch may control the gain in the system, while the second switch controls the active power stages. The threshold voltage, Vthresh, may be based on the power handling capability of individual stage. When the input voltage is above the threshold voltage Vthresh, all the power stages may be active. The output load is effectively shared by all the N converters, wherein N may be generally a power of 2. When the input voltage is less than Vthresh, the total time may be divided into log 2(N) subdivisions.

FIG. 7 illustrates example voltage waveforms and subdivisions, according to embodiments of the present disclosure. Waveforms and subdivisions may be shown for N=4. There will be two subdivisions for input voltage below Vthresh, referenced as "ab" and "bc", When the input voltage is rising from zero towards the peak (ascending, "I"), the first subdivision ab may be active. During this time, converter I is active, and the gain selected is N (4). The frequency of converter I may be I/4th of the nominal frequency if all the converters were active. All other converters may be switched off, and only converter I supplies the load current.

Figure 8:
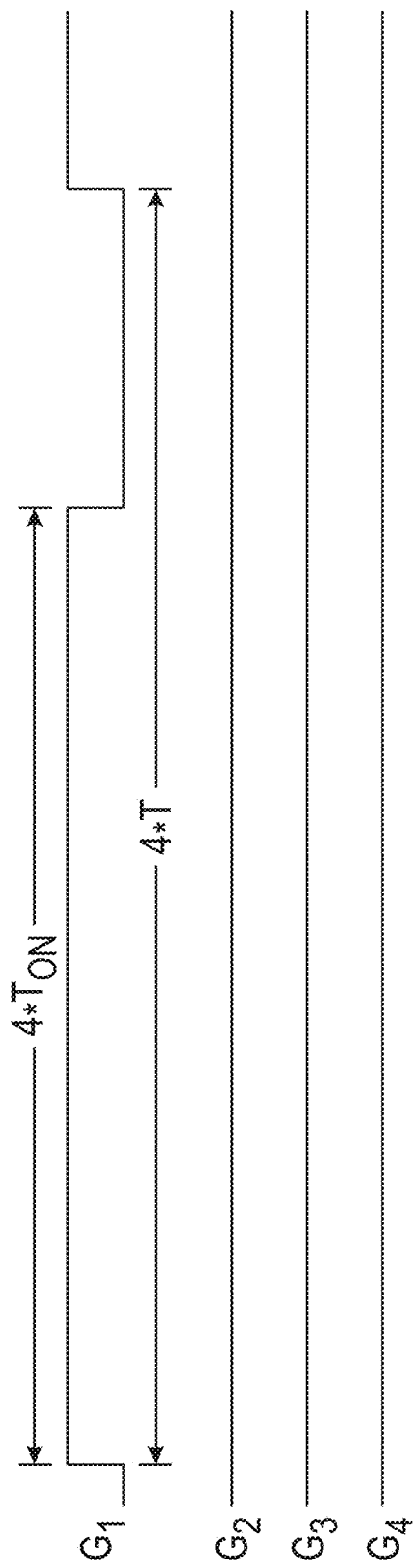
FIGS. 8-9 show switching PWM waveforms during operation of the embodiment of FIG. 6.

FIG. 8 illustrates gate waveforms for the first subdivision ab, according to embodiments of the present disclosure. The operation will continue in this subdivision until the voltage increases beyond Vthresh/2. When the input goes beyond Vthresh/2, the operation may enter subdivision bc. During this time, the converters 1 and 2 may operate at half the nominal frequency and a gain of 2, while converters 3 and 4 are off.

Figure 9:
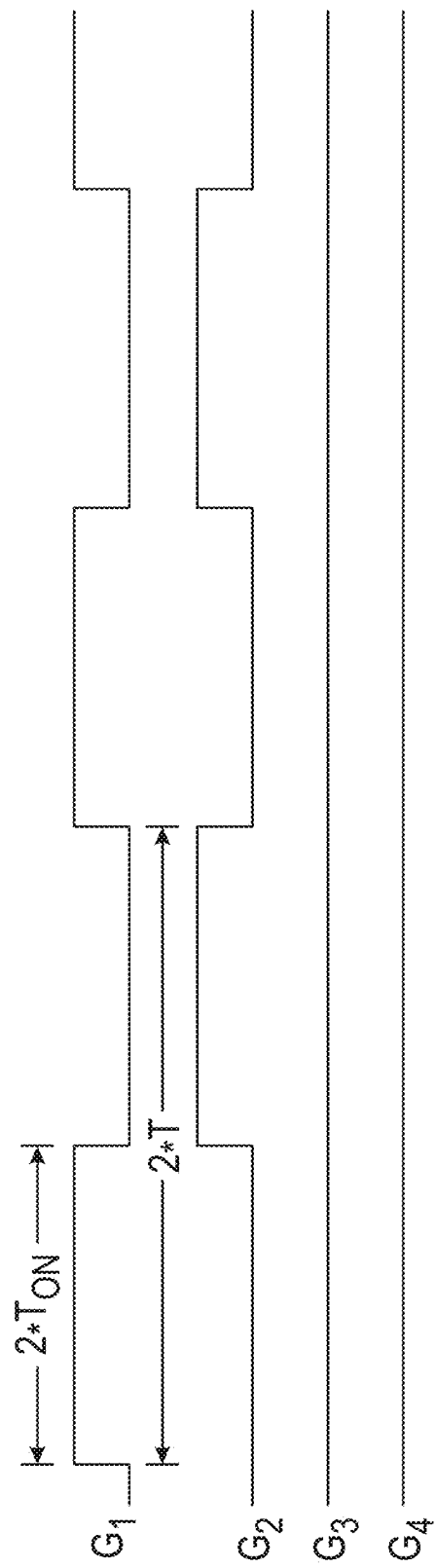

FIG. 9 illustrates gate waveforms for the second subdivision bc, according to embodiments of the present disclosure. When the input voltage exceeds Vthresh, all of the 4 converters may operate with a gain of 1 (II) (or cc'). FIG. 8 illustrates gate waveforms and input current ripple for period II, according to embodiments of the present disclosure. In the descending cycle (III), when the input voltage is below Vthresh, the operation may enter subdivision c'b'. During this time, the converters 3 and 4 may be active with a gain of ½ and twice the nominal frequency, while converters 1 and 2 are off. When the input voltage falls below Vthresh/2, the subdivision b'a' may become active. During this time, the converter 4 may operate with a frequency of ¼ times the nominal frequency and a gain of 4, while other converters are off. In the next half of the input cycle, during the subdivision ab, converter 2 may take the place of converter 1, and converter 3 can take place of converter 4 during subdivision b'a'. The converters may be interchanged in order to provide uniform stresses to all the converters thereby increasing reliability. The switching sequence for N=4 is provided in FIG. 9, according to embodiments of the present disclosure.

FIGS. 10-13 illustrate screenshots from oscilloscopes or simulations for the operation and performance of the system, according to embodiments of the present disclosure.

Because boundary PFC has a variable switching frequency within a line cycle, achieving the frequency and phase synchronization is difficult with interleaved converters. Embodiments of the present disclosure include switching after the phase and zero current conditions are met in an interleaved converter. Embodiments of the present disclosure do not depend on any complex compensator changes, and manages the power stage change using gain change.

Although particular embodiments have been illustrated in the present disclosure, additions, modifications, subtractions, and other alterations may be made to the example embodiments of the present disclosure without departing from the spirit and teachings of the present disclosure.

What is claimed is:

1. A circuit arrangement for interleaved switched boundary mode power conversion, comprising at least:
    an input for receiving an alternating input voltage from a power supply;
    an output to provide an output voltage to a load;
    a first interleaved circuit comprising:
        a first energy storage device; and
        a first controllable switching device; and
    one or more secondary interleaved circuits, each comprising:
        a secondary energy storage device; and
        a secondary controllable switching device;
    said circuit arrangement further comprising a signal processor, connected to the controllable switching devices;
    the signal processor comprising at least
    a first switching cycle controller, configured for cycled zero-current switching operation of the first controllable switching device; and
    one or more secondary switching cycle controllers, configured for cycled zero-current switching operation of the one or more secondary controllable switching devices, wherein
    the signal processor is configured to disable one or more of the interleaved circuits when the alternating input voltage is lower than a first threshold voltage to reduce a zero-crossing time, and wherein
    the signal processor is further configured to control a gain multiplier for at least one of an on-time period of the controllable switching devices and a switching cycle time, wherein in case one or more of the interleaved circuits are disabled, the gain multiplier is increased.

2. The circuit arrangement of claim 1, wherein the signal processor is further configured to re-enable one or more of the interleaved circuits when the alternating input voltage is higher than the first threshold voltage.

3. The circuit arrangement of claim 1, wherein the increase of the gain multiplier depends on the number of disabled interleaved circuits.

4. The circuit arrangement of claim 1, wherein the increase of the gain multiplier corresponds to the quotient of the total number of interleaved circuits in the circuit arrangement by the number of non-disabled interleaved circuits.

5. The circuit arrangement of claim 1, wherein the signal processor is further configured to control the gain multiplier so that the open loop system bandwidth is constant.

6. The circuit arrangement of claim 1, wherein the signal processor is further configured to control, in a given switching cycle, an on-time period of each non-disabled controllable switching device to correspond to each other.

7. The circuit arrangement of claim 1, wherein the signal processor is further configured to control phases between the on-time periods of the non-disabled switching devices, so that the on-time periods are distributed over the given switching cycle to reduce an overall current ripple at the input.

8. The circuit arrangement of claim 1, wherein the signal processor is configured to disable an increasing number of the controllable switching devices with a decrease of the alternating input voltage.

9. The circuit arrangement of claim 1, wherein the signal processor is configured to vary which interleaved circuits are disabled within a half-cycle of the alternating input voltage to equalize stress of the interleaved circuits.

10. The circuit arrangement of claim 1, wherein the signal processor is configured to vary which interleaved circuits are disabled in two subsequent half-cycles of the alternating input voltage to equalize stress of the interleaved circuits.

11. The circuit arrangement of claim 1, wherein the signal processor is configured with multiple different threshold voltages, wherein the first threshold voltage is the highest of the threshold voltages and each other threshold voltage of the multiple threshold voltages is half of a another threshold voltage of the multiple threshold voltages; and wherein the signal processor is configured to disable a number of interleaved circuits when the alternating input voltage falls below one of the multiple threshold voltages.

12. The circuit arrangement of claim 11, wherein the number of threshold voltages depends on the number of interleaved circuits of the circuit arrangement.

13. The circuit arrangement of claim 11, wherein the number of threshold voltages corresponds to the binary logarithm of the number of interleaved circuits of the circuit arrangement.

14. The circuit arrangement of claim 1, wherein the number of interleaved circuits of the circuit arrangement is a power of 2.

15. The circuit arrangement of claim 11, wherein one or more of the threshold voltages are predefined.

16. The circuit arrangement of claim 11, wherein the number of threshold voltages is dynamically determined, based on a peak level of the input voltage.

17. The circuit arrangement of claim 1, wherein the signal processor during zero-current switching is configured to control the switching devices at least at one zero-current point of the associated energy storage device.

18. The circuit arrangement of claim 1, wherein the signal processor is configured to control the switching devices from an off-state to an on-state at the at least one zero-current point.

19. The circuit arrangement of claim 1, wherein the signal processor is configured to control the on-time periods to correspond to each other in every switching cycle.

20. The circuit arrangement of claim 1, wherein the signal processor is configured to control the phases between the on-time periods of the first and the one or more secondary switching controllers in every switching cycle.

21. The circuit arrangement of claim 1, wherein each switching cycle controller is configured for PWM operation of the associated controllable switching device.

22. The circuit arrangement of claim 1, wherein the signal processor comprises a delay module, configured so that the at least one switching point is delayed for a predetermined delay time.

23. The circuit arrangement of claim 1, wherein the signal processor further comprises a limiter, configured to provide maximum on-time information to the PWM module.

24. The circuit arrangement of claim 1, wherein the circuit arrangement is a boost converter.

25. The circuit arrangement of claim 1, further comprising a rectifier circuit to rectify an AC input voltage.

26. A signal processor for use in a circuit arrangement for interleaved switched boundary mode power conversion with at least a first controllable switching device and one or more secondary controllable switching devices; said signal processor being connectable to the controllable switching devices and being configured for zero-current switching of the switching devices; wherein the signal processor comprises at least:
    a first switching cycle controller, configured for cycled zero-current switching operation of the first controllable switching device; and
    one or more secondary switching cycle controllers, configured for cycled zero-current switching operation of the one or more secondary controllable switching devices, wherein
        the signal processor is configured to disable one or more of the controllable switching devices when an alternating input voltage of the circuit arrangement is lower than a first threshold voltage, and wherein
    the signal processor is further configured to control a gain multiplier for at least one of an on-time period and a switching cycle time of at least one of the controllable switching devices, wherein in case one or more of the controllable switching devices are disabled, the gain multiplier is increased.

27. A method of interleaved switched boundary mode power conversion with a circuit comprising an input for receiving an alternating input voltage from a power supply; an output to provide an output voltage to a load; a first controllable switching device; and one or more secondary controllable switching devices; wherein
    one or more of the controllable switching devices are disabled when the alternating input voltage is lower than a first predefined voltage, and wherein
    a gain multiplier for at least one of an on-time period and a switching cycle time of at least one of the controllable switching devices is controlled, wherein in case one or more of the controllable switching devices are disabled, the gain multiplier is increased.

28. A non-transitory machine-readable medium including contents that are configured to cause a signal processor to conduct the method of claim 27.

29. A circuit arrangement for interleaved switched boundary mode power conversion, comprising at least:
    an input for receiving an alternating input voltage from a power supply;
    an output to provide an output voltage to a load;
    a first interleaved circuit comprising:
        a first energy storage device; and
        a first controllable switching device; and
    one or more secondary interleaved circuits, each comprising:
        a secondary energy storage device; and
        a secondary controllable switching device;
    said circuit arrangement further comprising a signal processor, connected to the controllable switching devices; the signal processor comprising at least
    a first switching cycle controller, configured for cycled zero-current switching operation of the first controllable switching device; and
    one or more secondary switching cycle controllers, configured for cycled zero-current switching operation of the one or more secondary controllable switching devices, wherein
    the signal processor is configured to disable one or more of the interleaved circuits when the alternating input voltage is lower than a first threshold voltage, and wherein
    the signal processor is further configured in case one or more of the interleaved circuits are disabled, to increase at least one of an on-time period and a switching cycle time of one or more of the controllable switching devices of one or more of the interleaved circuits that are not disabled.

* * * * *